United States Patent
Taylor

(10) Patent No.: US 7,432,539 B2
(45) Date of Patent: Oct. 7, 2008

(54) IMAGING METHOD UTILIZING THYRISTOR-BASED PIXEL ELEMENTS

(75) Inventor: Geoff W. Taylor, Storrs-Mansfield, CT (US)

(73) Assignees: The University of Connecticut, Farmington, CT (US); Opel, Inc., Shelton, CT (US)

( * ) Notice: Subject to any disclaimer, the term of this patent is extended or adjusted under 35 U.S.C. 154(b) by 0 days.

(21) Appl. No.: 11/780,745

(22) Filed: Jul. 20, 2007

(65) Prior Publication Data
US 2007/0257275 A1    Nov. 8, 2007

Related U.S. Application Data

(60) Division of application No. 10/689,019, filed on Oct. 20, 2003, now Pat. No. 7,247,892, and a continuation-in-part of application No. PCT/US03/13183, filed on Apr. 28, 2003, and a continuation-in-part of application No. PCT/US02/06802, filed on Mar. 4, 2002, which is a continuation-in-part of application No. 09/556,285, filed on Apr. 24, 2000, now Pat. No. 6,870,207.

(51) Int. Cl.
*H01L 27/146* (2006.01)

(52) U.S. Cl. ............ 257/197; 257/198; 257/183.1; 257/623; 438/312

(58) Field of Classification Search ........ 257/197, 257/198, 183.1, 623; 438/312
See application file for complete search history.

(56) References Cited

U.S. PATENT DOCUMENTS

| | | | |
|---|---|---|---|
| 3,919,656 A | 11/1975 | Sokal et al. | 330/51 |
| 4,229,752 A | 10/1980 | Hynecek | 357/24 |
| 4,424,525 A | 1/1984 | Mimura | 257/217 |
| 4,584,697 A | 4/1986 | Hazendonk et al. | 377/60 |
| 4,658,403 A | 4/1987 | Takiguchi et al. | 372/96 |
| 4,683,484 A | 7/1987 | Derkits, Jr. | 357/16 |
| 4,806,997 A | 2/1989 | Simmons et al. | 357/16 |

(Continued)

FOREIGN PATENT DOCUMENTS

WO    PCT/US02/06802    9/2002

(Continued)

OTHER PUBLICATIONS

Song et al., "A Resistive-Gate Al0.3GA 0.7As/GaAs 2 DEG CCD with High Charge-Transfer Efficient at 1 Ghz" IEEE Transactions on Electron Devices, vol. 38, No. 4, Apr. 1991, pp. 930-932.

(Continued)

*Primary Examiner*—Howard Weiss
*Assistant Examiner*—Steven H Rao
(74) *Attorney, Agent, or Firm*—Gordon & Jacobson, PC

(57) ABSTRACT

An improved imaging array (and corresponding method of operation) includes a plurality of heterojunction thyristor-based pixel elements disposed within resonant cavities formed on a substrate. Each thyristor-based pixel element includes complementary n-type and p-type modulation doped quantum well interfaces that are spaced apart from one another. Incident radiation within a predetermined wavelength resonates within the cavity of a given pixel element for absorption therein that causes charge accumulation. The accumulated charge is related to the intensity of the incident radiation. The heterojunction-thyristor-based pixel element is suitable for many imaging applications, including CCD-based imaging arrays and active-pixel imaging arrays.

25 Claims, 14 Drawing Sheets

U.S. PATENT DOCUMENTS

| | | | |
|---|---|---|---|
| 4,814,774 A | 3/1989 | Herczfeld | 432/372 |
| 4,827,320 A | 5/1989 | Morkoc et al. | 357/22 |
| 4,829,272 A | 5/1989 | Kameya | 333/139 |
| 4,899,200 A | 2/1990 | Shur et al. | 357/30 |
| 4,949,350 A | 8/1990 | Jewell et al. | 372/45 |
| 4,995,061 A | 2/1991 | Hynecek | 377/58 |
| 5,010,374 A | 4/1991 | Cooke et al. | 357/16 |
| 5,105,248 A | 4/1992 | Burke et al. | 357/24 |
| 5,202,896 A | 4/1993 | Taylor | 372/50 |
| 5,239,550 A | 8/1993 | Jain | |
| 5,337,328 A | 8/1994 | Lang et al. | 372/45 |
| 5,386,128 A | 1/1995 | Fossum et al. | 257/183.1 |
| 5,422,501 A | 6/1995 | Bayraktaroglu | 257/195 |
| 5,436,759 A | 7/1995 | Dijaili et al. | 359/333 |
| 5,517,244 A | 5/1996 | Stekelenburg et al. | 348/305 |
| 5,627,854 A | 5/1997 | Knox | |
| 5,698,900 A | 12/1997 | Bozada et al. | 257/744 |
| 6,031,243 A | 2/2000 | Taylor | 257/192 |
| 6,242,794 B1 | 6/2001 | Enquist | |
| 6,335,255 B1 | 1/2002 | Evaldsson et al. | |
| 6,351,001 B1 | 2/2002 | Stevens et al. | 257/223 |
| 6,466,604 B1 | 10/2002 | Kopf | |
| 6,479,844 B2 | 11/2002 | Taylor | 257/192 |
| 6,531,721 B1 | 3/2003 | Burton et al. | |
| 6,756,281 B2 | 6/2004 | Enquist | |
| 6,917,061 B2 | 7/2005 | Pan et al. | |
| 7,091,082 B2 | 8/2006 | Feng et al. | |
| 2001/0019873 A1 | 9/2001 | Enquist | |
| 2001/0043629 A1 | 11/2001 | Sun et al. | 372/43 |
| 2002/0067877 A1 | 6/2002 | Braun | 385/15 |

FOREIGN PATENT DOCUMENTS

| | | |
|---|---|---|
| WO | PCT/US03/13183 | 10/2003 |

OTHER PUBLICATIONS

Ula et al., "Simulation, Design and Fabrication of Thin Film Resistive-Gater GaAs Charge Coupled Devices," Electron Devices Meeting, 1990, pp. 271-274.

Bakker et al. "A Tracking CCD: A New CCD Concept." IEE Transactions on Electron Devices, vol. 38, No. 5, May 1991, pp. 1193-1200.

Davidson et al., "GaAs charge-coupled devices", Can. J. Physics, vol. 67, 1989, pp. 225-231.

Song et al. "Characterization of Evaporated Cr-SiO cermet films resistive-gate CCD applications", IEE Transations on Electron Devices, vol. 36, No. 9, Sep. 1989; pp. 1575-1597.

LeNoble et al., "A Two-Phase GaAs Cermet Gate Charge-Coupled Device.", IEEE Transactions on Electron Devices, vol. 37, No. 8, Aug. 1990, pp. 1796-1799.

Beggs et al., "Optical Charge Injection into a Gallium Arsenide Acoustic Charge Transport Device," Journal of Applied Physics, vol. 63, Issue 7, 1988 pp. 2425-2430.

Ablassmeier et al., "Three-phase GaAs Schottky-barrier CCD Operated up to 100-MHz Clock Frequency," IEE Transactions on Electron Devices, vol. 27, No. 6 Jun. 1980, pp. 1181-1183.

Le Noble et al., Uniphase Operation of a GaAs Resistive Gate Charge-Coupled Device, Can. J. Physics, vol. 70, 1992; pp. 1143-1147.

Le Noble et al., "Two-Phase GaAs Cermet-Gate Charge-Coupled Devices," Can. J. Physics, vol. 69, 1991, pp. 224-227.

Ula et al., "Optimization of thin-film resistive-gate and capacitive-gate GAAs charge-coupled devices," IEEE Transactions on Electron Devices, vol. 39, No. 5, May 1992, pp. 1032-1040.

LeNoble et al., "The Surface Potential Variation in the Interelectrode Gaps of GaAs Cermet-gate Charge-Coupled Devices," Solid-State Electronics, vol. 33, No. 7, 1990, pp. 851-857.

Kodak CCD Primer, #KCP-001, Charge-Coupled Device (CCD) Image Sensors, http://www.kodak.com/US/en/digital/pdf/ccdPrimerPart2.pdf, 1992.

Gunapala et al., "Quantum Well Infrared Photodetector (QWIP) Focal Plane Arrays", Semiconductors and Semimetals series, vol. 62, 1999.

Albert J. P. Theuwissen, "Solid-State Imaging with Charge-Coupled Devices." Kluwer Academic Publishers, Mar. 1995, pp. 54-63.

P.A. Kiley et al., Submicrometre Gate Length Scaling of Inversion Channel Heterojunction Field Effect Transistor, Electronic Letters Mar. 17, 1994, vol. 30. No. 6 pp. 529-531.

G. W. Taylor and P. A. Kiely, Theoretical and Experimental Results for the Inversion Channel Heterostructure Field Effect Transistor, IEE Proceedings-G, vol. 140, No. 6, Dec. 1993.

S.V. Bandara et al., Broad-Band GaAs/AlxGa1-xAs QWIPS, NASA Tech. Brief vol. 23, No. 4 (from JPL New Technology Report NPO-20319) Apr. 1999.

Lee H. Wicks G & Eastman L.F., "High Temperature Annealing of Modulation Doped GaAs/A1 GaAs Heterostructures for FET Applications" IEEE/Cornell Conf. On High Speed Semiconductor Devices & Ckts, Aug. 1983, pp. 204-208.

Taylor G. & Simmons J., Heterojunction Field-Effect Transistor (HFET) Electronics Letters, Jul. 17, 1986, vol. 22, No. 15, pp. 784-786.

Cates, C., Serapiglia B., Dora Y, et al. Detection of Terahertz Light With Intersubband Transition in Semiconductor Quantum Wells, University of California, 1994.

Y. Akahori et al., "10-Gb/s High-Speed Monolithically Integrated Photoreceiver Using GaAs p-l-n PD and Planar Doped InA1As/InGaAs Hemt's", IEEE Photonics Technology Letters, vol. 4, No. 7, Jul. 1992.

Kiyoto Takahata et al., "10-Gbit/s InP-Based High-Performance Monolithic Photoreceivers Consisting of p-i-n Photodiodes and HEMT's", IEICE Trans. Electron, vol. E83-C, No. 6, Jun. 2000.

N.K. Dutta et al. "10-Ghz Bandwidth Monolithic p-i-n Modulation-Doped Field Effect Transistor Photoreceiver" Appl. Phys. Lett., vol. 63, No. 15, Oct. 11, 1993.

V. Hurm et al. "20 Gbit/s Long Wavelength Monolithic Integrated Photoreceiver Grown on GaAs", Electronic Letters, vol. 33, No. 7 Mar. 27, 1997.

M. Berroth et al., "Monolithic Integrated Optoelectronic Circuits" 0-7803-2442-0-9/95 IEEE, 1995.

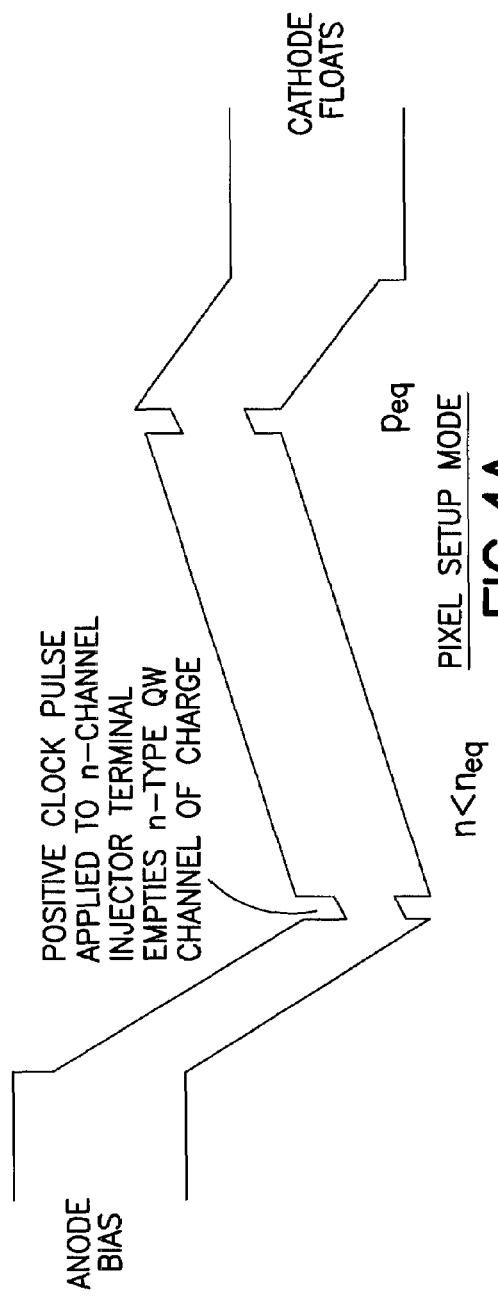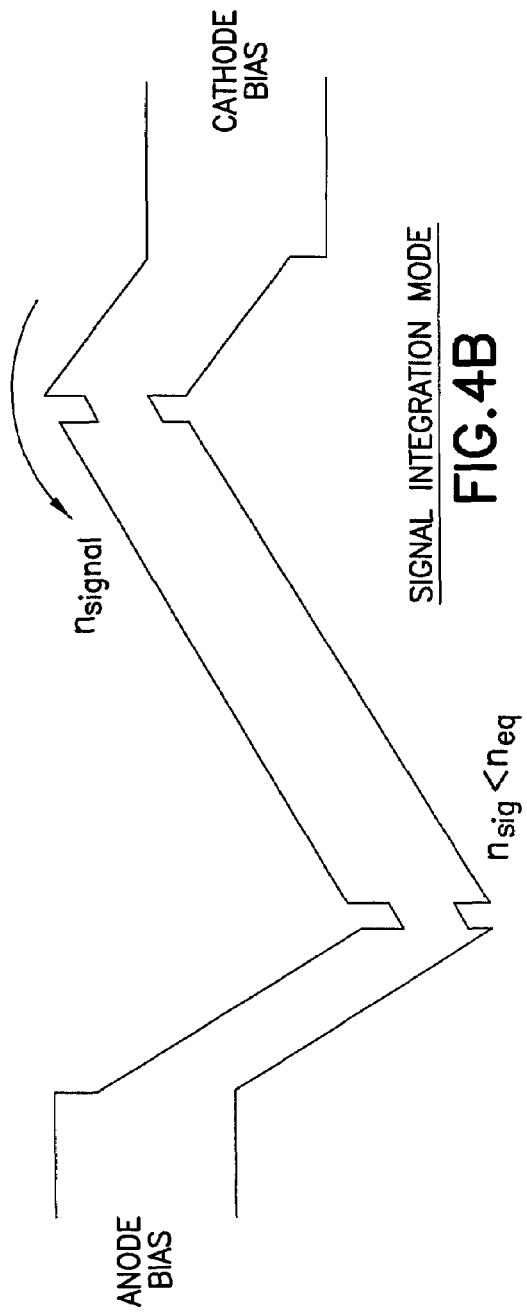

SIGNAL TRANSFER MODE

| | LAYER MATERIAL | LAYER DOPING TYPE | TYPICAL DOPING CONCENTRATION (atoms/cm$^{-3}$) | TYPICAL LAYER THICKNESS(Å) | LAYER # |
|---|---|---|---|---|---|
| 126 { | InGaAs | P+ | 1E20 | 25 | 1165b |
|  | GaAs | P+ | 1E20 | 75 | 1165a |
|  | Al(.7)Ga(.3)As | P | 1E17 | 700 | 1164b |
|  | Al(.7)Ga(.3)As | P+ | 1E19 | 10 | 1164a |
|  | Al(.15)Ga(.85)As | P+ | 3.5E18 | 25 | 1163d |
| 124 { | Al(.15)Ga(.85)As | UND | UND | 200-300 | 1163c |
|  | Al(.15)Ga(.85)As | N+ | 3.5E18 | 80 | 1163b |
|  | Al(.15)Ga(.85)As | UND | UND | 20-30 | 1163a |
| 122 { | GaAs | UND | UND | 15 | 1162 |
|  | In(.20)Ga(.80)AsN  }x3 | UND | UND | 60 | 1161 |
|  | GaAs | UND | UND | 100 | 1160b |
|  | GaAs | UND | UND | 100-250 | 1160a |
| 120 { | Al(.15)Ga(.85)As | UND | UND | 5000 | 1159 |
| 118 { | GaAs  }x3 | UND | UND | 100 | 1158 |
|  | In(.20)Ga(.80)AsN | UND | UND | 60 | 1157 |
|  | GaAs | UND | UND | 15 | 1156 |
|  | Al(.15)Ga(.85)As | UND | UND | 30 | 1155d |
| 116 { | Al(.15)Ga(.85)As | P+ | 3.5E18 | 80 | 1155c |
|  | Al(.15)Ga(.85)As | UND | UND | 300 | 1155b |
| 114 { | Al(.15)Ga(.85)As | N+ | 3.5E18 | 80 | 1155a |
|  | Al(.7)Ga(.3)As | N | 1E17 | 700 | 1154 |
|  | GaAs | N+ | 3.5E18 | 2200 | 1153 |
|  | AlAs | UND | UND | 1701 | 1151 |
| 112 { | GaAs  }x7 | UND | UND | 696 | 1152 |
|  | AlAs | UND | UND | 1701 | 1151 |
| 110 { | GaAs SUBSTRATE |  | SI |  | 1149 |

FIG.5

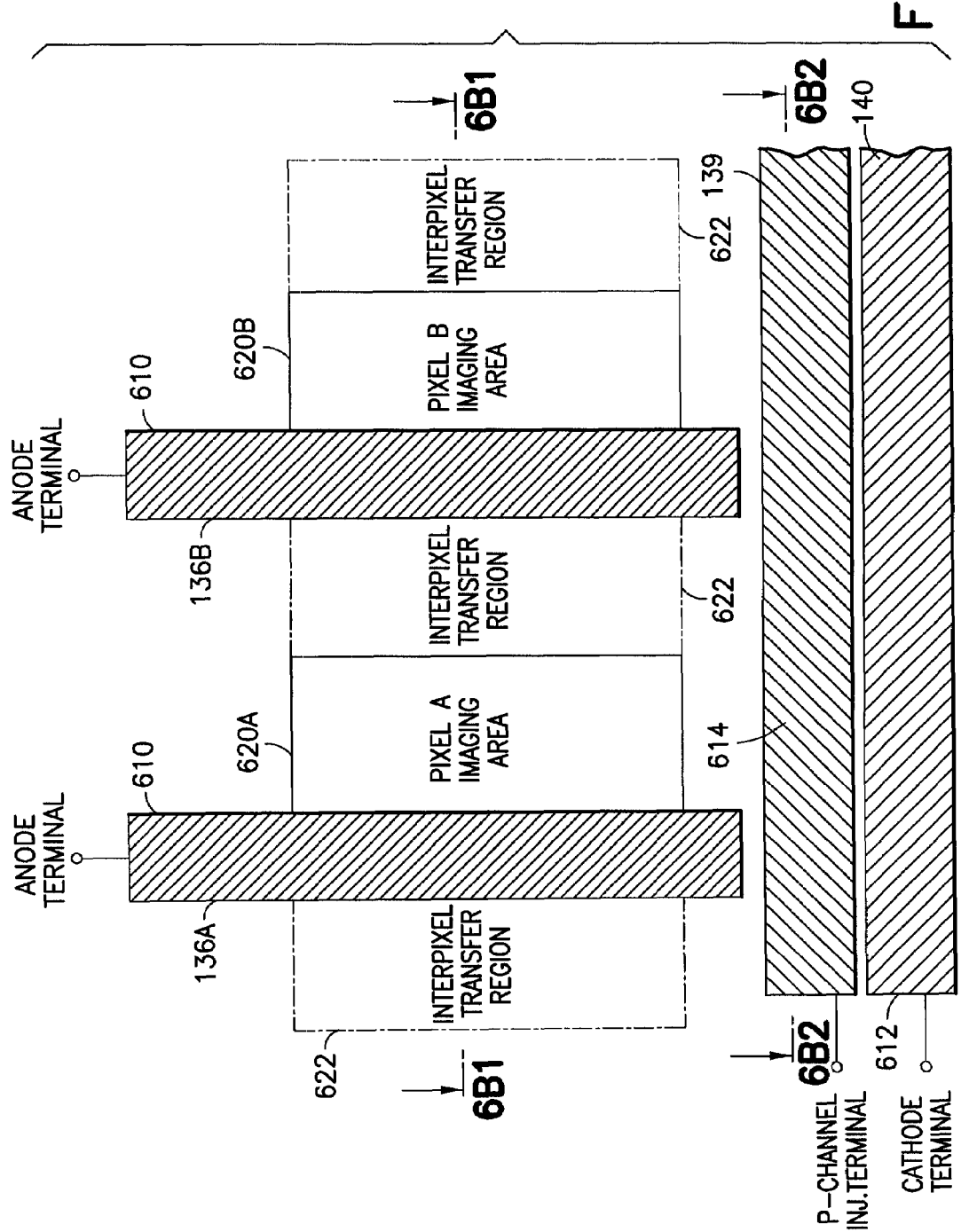

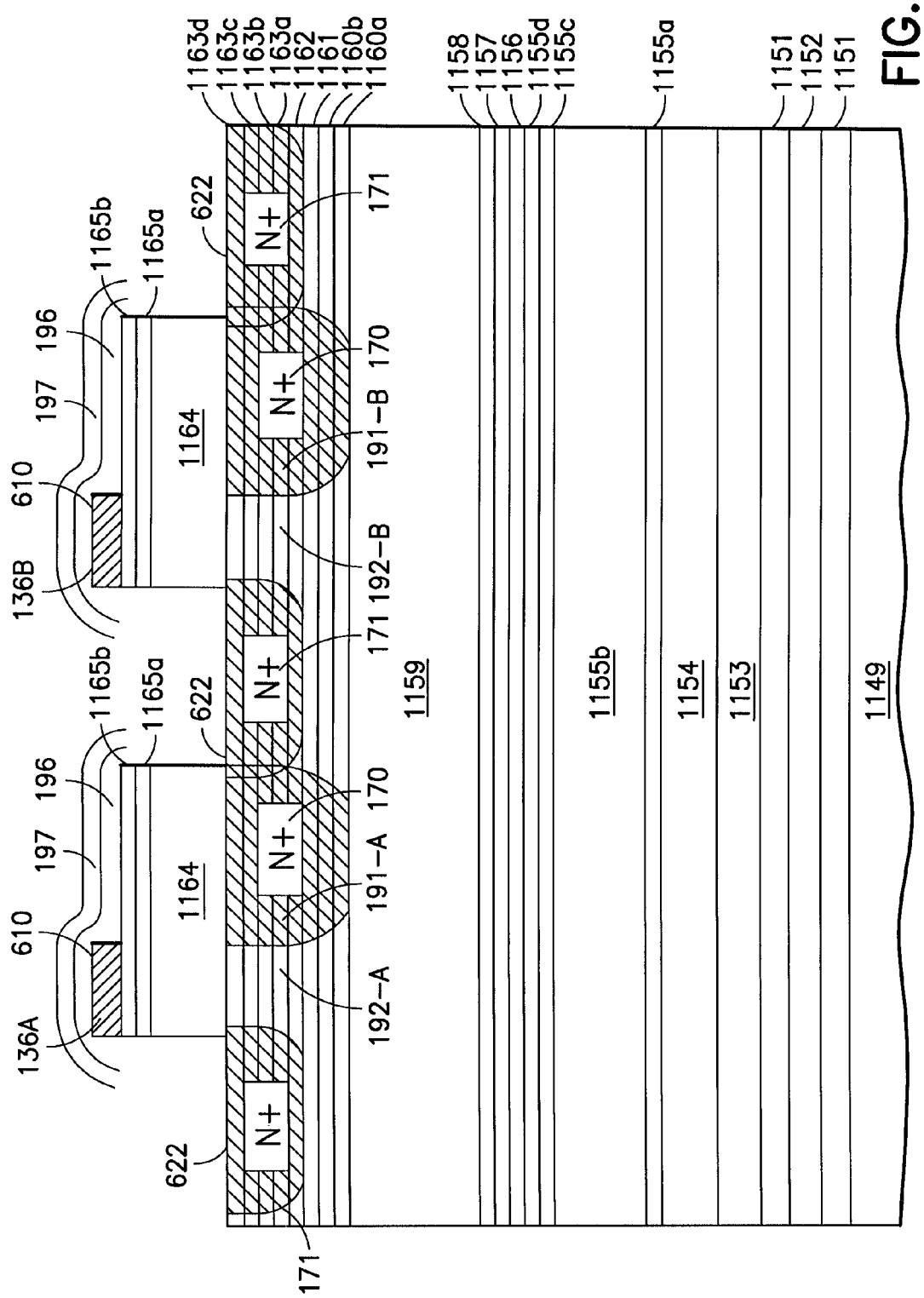

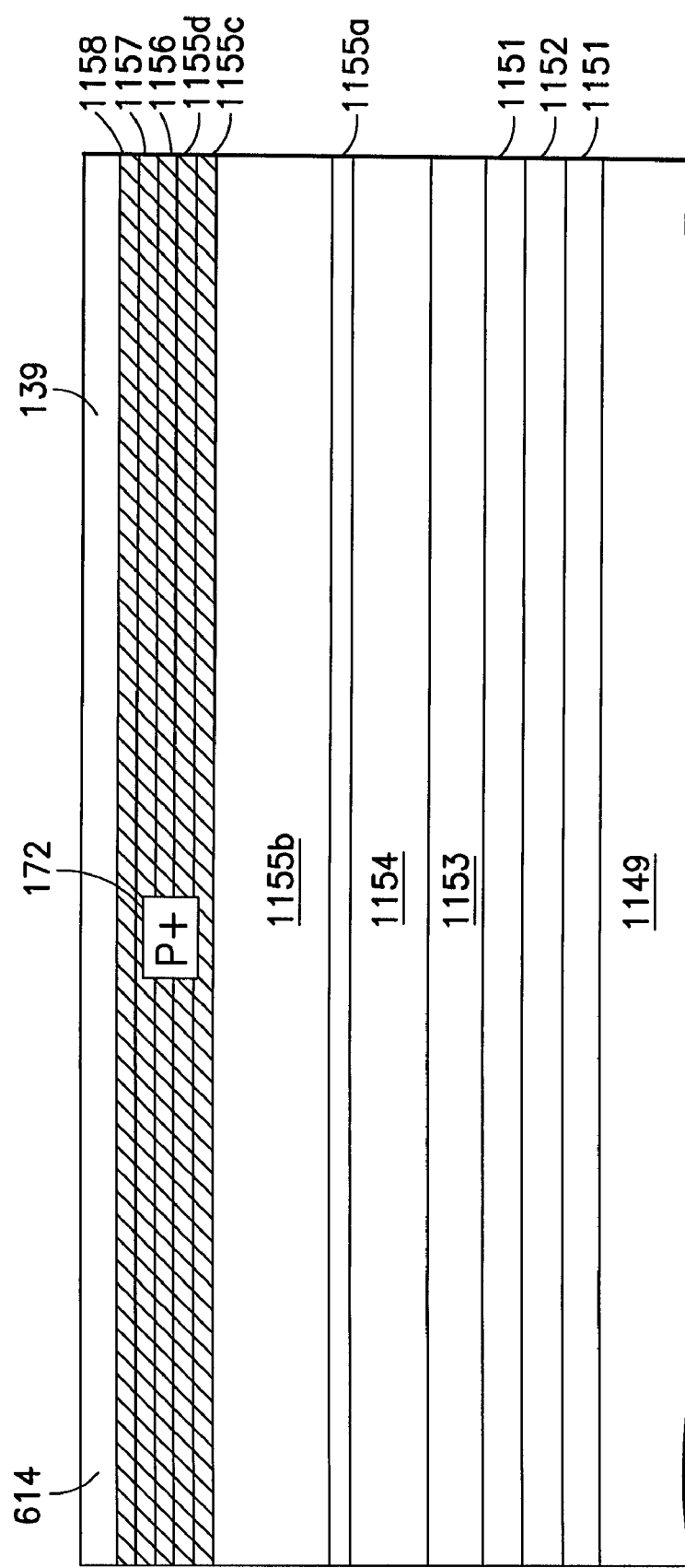
FIG.6B2

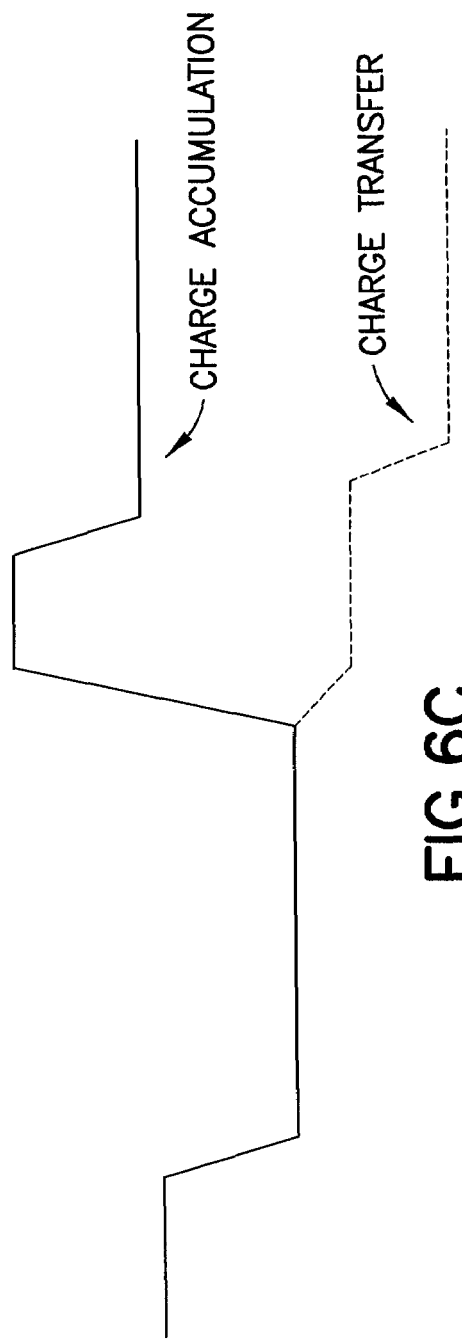
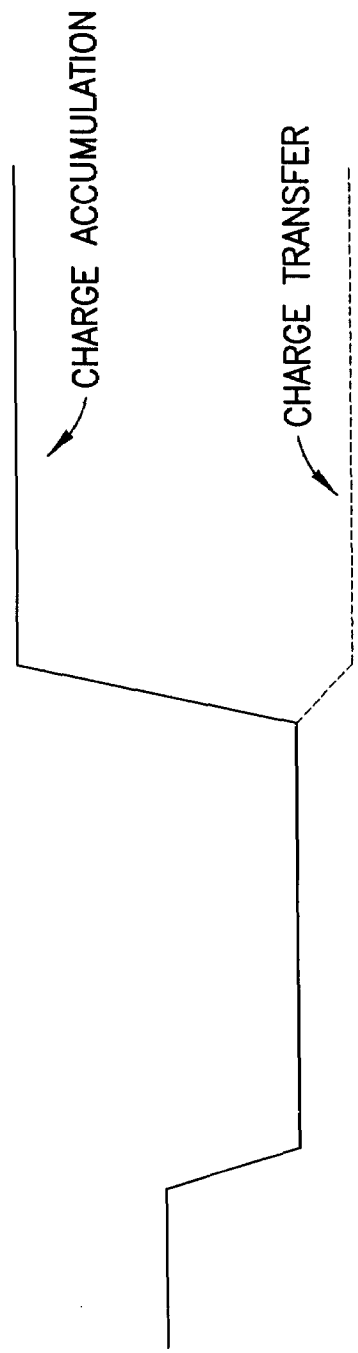

IMAGING METHOD UTILIZING THYRISTOR-BASED PIXEL ELEMENTS

This application is a divisional of U.S. Ser. No. 10/689,019 (now U.S. Pat. No. 7,247,892) to Taylor, filed Oct. 20, 2003 and entitled "Imaging Array Utilizing Thyristor-Based Pixel Elements", which is a continuation-in-part of U.S. Ser. No. 09/556,285 (now U.S. Pat. No. 6,870,207) to Taylor, filed Apr. 24, 2000 and entitled "A III-V Charge Coupled Device Suitable for Visible Near and Far Infrared Detection", and a continuation-in-part of International Application No. PCT/US02/06802 to Taylor filed Mar. 4, 2002, and a continuation-in-part of International Application No. PCT/US03/13183 to Taylor filed Apr. 28, 2003, all of which are hereby incorporated by reference herein in their entireties.

BACKGROUND OF THE INVENTION

1. Field of the Invention

The present invention relates to optoelectronic devices. More particularly, the present invention relates to imaging arrays based on charged coupled devices (CCD) formed from semiconductors such as gallium arsenide (GaAs) which are capable of generating electrical signals in response to light. The invention is particularly applicable to the imaging and the telecommunications arts, although it is not limited thereto.

2. State of the Art

In the imaging arts, next generation imaging systems must operate at very high frequencies and have a high resistance to radiation flux such that the imager is said to be "radiation hardened." State-of-the-art imagers are constructed as silicon integrated circuits in the form of CCDs or active pixel arrays. In the CCD, a linear array of pixels is clocked sequentially to a common output amplifier. In the active pixel array, the array is x-y addressable and each pixel is output to its own dedicated amplifier (the array is output on a row by row or column by column basis).

Silicon technology is limited by the presence of the silicon oxide in both the active and passive regions of the integrated circuit in a number of ways. A main limitation is the sensitivity of the oxide to radiation flux. The radiation creates traps and other charged defects in the insulator which alter the internal voltage thresholds in both active and passive regions within the integrated circuit. After a certain cumulative exposure level, these threshold changes render the circuit inoperable. The gate oxide creates limitations in other ways as well. The silicon CCD couples one pixel to the other via overlapping gates. Each overlapping gate creates a small region of thicker oxide between pixels which inhibits charge transfer and therefore sets a speed limitation upon the CCD. These oxide barriers are fundamental to the silicon CCD and constitute a transfer speed limitation. Some approaches have been employed to eliminate these effects such as the virtual phase CCD. However, these structures are then faced with barriers created by implant misalignment and a lack of well capacity. In any event the transfer speed in the silicon CCD rarely exceeds a few MHz.

A further limitation of the silicon CCD is its spectral sensitivity. The silicon CCD absorbs radiation across its energy gap and therefore is insensitive to radiation with a wavelength longer than about 1 um. It is also insensitive to ultraviolet (UV) radiation.

As disclosed in parent application U.S. Ser. No. 09/556,285, III-V device structures based upon GaAs substrates have the potential to overcome the above limitations. In particular, the GaAs CCD has the potential to absorb electromagnetic energy within a quantum well between the various subbands. This provides the GaAs device with unique capabilities of intersubband absorption and sensitivity in the mid wavelength infrared, long wavelength infrared and very long wavelength infrared regions. The GaAs device structures that currently perform the intersubband detector functions are the QWIP (quantum well infrared photodetector) devices. Two significant limitations of the QWIP as currently implemented are the existence of a significant level of dark current that necessitates cooling of the device to 77° K., and the fact that the device is not compatible with GaAs integrated circuits. When originally demonstrated, the QWIP was considered advantageous because of its potential compatibility with GaAs integrated circuits. However, this compatibility has never been established and so present technology combines the GaAs QWIP wafer in a hybrid fashion with a Si read-out integrated circuit.

There have been several efforts to build CCD shift registers using the basic transistor structures of the MESFET (metal semiconductor field effect transistor) and HEMT (high electron mobility transistor) devices. See Song et al., "A Resistive-Gate $Al_{0.3}Ga_{0.7}As/GaAs$ 2DEG CCD with High Charge-Transfer Efficient at 1 GHz," IEEE Transactions on Electron Devices, Vol. 38, No. 4, April 1991, pgs. 930-932; Ula et. al., "Simulation, Design and Fabrication of Thin-Film Resistive-Gate GaAs Charge Coupled Devices," Electron Devices Meeting, 1990, pgs. 271-274; Bakker et al., "A Tacking CCD: a New CCD Concept," IEEE Transactions on Electron Devices, Vol. 38, No. 5, May 1991, pgs. 1193-1200; Davidson et al., "GaAs charge-coupled devices", Can. J. Physics, Vol. 67, 1989, pgs. 225-231; Song et al., "Characterization of Evaporated Cr—SiO cermet films resistive-gate CCD applications," IEEE Transactions on Electron Devices, Vol. 36, No. 9, September 1989, pgs. 1575-1597; LeNoble et al., "A Two-Phase GaAs Cermet Gate Charge-Coupled Device," IEEE Transactions on Electron Devices, Vol. 37, No. 8, August 1990, pgs. 1796-1799; Beggs et al., "Optical charge injection into a gallium arsenide acoustic charge transport device," Journal of Applied Physics, Volume 63, Issue 7, 1988, pgs. 2425-2430; Ablassmeier et al., "Three-phase GaAs Schottky-barrier CCD Operated up to 100-MHz Clock Frequency," IEEE Transactions on Electron Devices, Vol. 27, No. 6, June 1980, pgs. 1181-1183; LeNobel et al., "Uniphase operation of a GaAs resistive gate charge-coupled device," Can. J. Physics, Vol. 70, 1992, pgs. 1143-1147; LeNobel et al., "Two-Phase GaAs cermet-gate charge-coupled devices," Can. J. Physics, Vol. 69, 1991, pgs. 224-227; Ula et al., "Optimization of thin-film resistive-gate and capacitive-gate GAAs charge-coupled devices," IEEE Transactions on Electron Devices, Vol. 39, No. 5, May 1992, pgs. 1032-1040; and LeNoble et al. "The Surface Potential Variation in the Interelectrode Gaps of GaAs Cermet-gate Charge-Coupled Devices," Solid-State Electronics, Vol. 33, No. 7, 1990, pgs. 851-857. These technologies have always been plagued by the problem of low transfer efficiencies between pixels in the array. The proposed solutions utilize a resistive coupling between pixels, which would provide drift aided transfer. The problem has been that no viable technique to implement resistive coupling has been found. The use of deposited resistive layers was attempted but the resistive control problems discouraged further investigations.

Parent application U.S. Ser. No. 09/556,285 overcomes many of these problems by providing a CCD having an epitaxial growth structure which utilizes a modulation doped quantum well interface to create an inversion channel for the storage of charge packets. The charge transfer is facilitated by the unique features of the epitaxial growth which include two delta-doped sheets of p-type doping. One p type sheet is very close to the inversion channel and enables a resistive coupling between adjacent pixels through a very thin sheet of highly doped material. The resistive coupling enables a high field and optimized drift velocity between pixels during the transfer phase which is responsible for the very high transfer rate. The second charge sheet positioned at the wafer surface enables a very low resistance ohmic contact to the top metal contact. It is this ohmic contact that enables the HFET, which is the fundamental field effect device in the technology. The inversion channel is comprised of multiple quantum wells and these quantum wells may absorb incident radiation in the MWIR (mid-wave infrared) and LWIR (long-wave infrared) regions. The CCD may also image signals in the UV, the visible and the near IR regions of the spectrum by conventional band gap absorption.

In the CCD device of the parent application Ser. No. 09/556,285, a refractory emitter or gate metal contact is used for the transfer portion of the pixel. Also, dielectrics are used above the gate to form ¼ wavelength pairs for the imaging portion of the pixel. These dielectrics, when taken together with an epitaxially grown mirror below the active device structure constitute a resonant cavity at the wavelength of interest. In the described embodiments, ion implants are used for several purposes. An N type implant is used to form source and drain regions to the inversion channel, and it is also used to shift the threshold voltage of the inversion channel interface. The epitaxial structure is grown as a normally off (enhancement) device and then the N type implant is used to create regions of normally on (depletion) devices and it is these regions where the charge packets are stored. Oxygen implants may also be used to create high resistance regions below the implants. The technology utilizes the oxidation of AlAs and other layers with large aluminum percentages to achieve passivation, isolation and dielectric mirrors below the structure. The basic structure of the pixel and the output amplifiers which are employed in the CCD may also be used to design an active pixel sensor. In such a design, each pixel is interfaced to an output amplifier and a row or a column is output in parallel.

While the devices disclosed in parent application U.S. Ser. No. 09/556,285 represent major advances over the prior art and provide practical solutions to the problems of the prior art, the disclosed devices still suffer from certain limitations. For example, with the provided structure, it can take one millisecond or so for electrons to remove themselves from the quantum wells in response to received light, and so the speed of the imaging process is limited by that timing. In addition, because the read-out signal generated by the disclosed device for a given period is the amount of charge remaining in the quantum wells, the read-out signal is large when the well is relatively full; i.e., when the light was weak. Thus, a weak signal is possibly undesirably subjected to a relatively large amount of noise.

SUMMARY OF THE INVENTION

It is therefore an object of this invention to provide an imaging array of pixel element, preferably utilizing a III-V semiconductor system, which is capable of very high transfer rates.

It is another object of the invention to provide an imaging array of pixel elements which can be adapted to absorb electromagnetic radiation in the broad spectral range from 3 um-20 um via intersubband absorption and convert the radiation to packets of charge for output therefrom.

It is a further object of this invention to provide an imaging array of pixel elements which can be adapted to absorb electromagnetic radiation in the ultra-violet, visible and near infra-red portions of the electromagnetic spectrum via bandgap absorption and convert the radiation to packets of charge for output therefrom.

It is an additional object of this invention to implement the imaging array of pixel elements in an integrated fashion together with HFET technology.

Another object of this invention to implement the imaging array of pixel elements as part of a monolithic optoelectronic integrated circuit that includes additional optoelectronic circuitry and/or electronic circuitry.

In accord with the objects of the invention, an imaging array (and corresponding method of operation) is provided having an epitaxial growth structure with complementary types of modulation doped quantum well interfaces; one which creates an inversion channel for electrons, and one which creates an inversion channel for holes. The epitaxial growth structure is preferably the same structure disclosed in previously incorporated U.S. Ser. No. 09/798,316 which relates to a modulation doped thyristor. More particularly, two modulation doped quantum well structures which are separated from each other are located below a p+ layer and above an n+ layer. The first modulation doped quantum well structure (referred to as the "n-type modulation doped quantum well interface) creates an inversion channel for the electrons, while the second modulation doped quantum well structure (referred to as the "p-type modulation doped quantum well interface) creates an inversion channel for holes. Dielectrics are used above the top p+ layer and below the bottom n+ layer to form ¼ wavelength pairs for the imaging portion of the pixel; i.e., they constitute a resonant cavity at the wavelength of interest.

In a preferred embodiment, the pixel elements of the imaging array are metallized as follows. For each pixel element, a refractory anode terminal is formed adjacent the highly doped top p+ layer; i.e., the top "p" structure. The anode terminal is used to control the transfer of charge into and/or from the pixel element. A p-channel injector terminal is operably coupled to the p-type modulation doped quantum well interface, and a cathode terminal is operably coupled to the bottom n+ layer. The p-channel injector terminal is used to empty the p-type quantum well interface of charge (e.g., holes). The cathode terminal is used to realize an electronic shutter that enables/disables the charge accumulation operations of the pixel element.

The pixel elements operate in three distinct modes: pixel setup mode; signal acquisition mode; and signal transfer mode. During pixel setup mode, the n-type quantum well interface is emptied of charge (e.g., electrons). During signal acquisition mode, charge is accumulated in the n-type quantum well interface of the pixel element. The amount of accumulated charge is proportional to the amount of electromagnetic radiation at the desired wavelength that is received at the pixel element. During signal transfer mode, the accumulated charge is read out from the pixel element (and transferred between pixel elements in CCD-type applications) utilizing the n-type quantum well interface as the pathway for charge transfer. In CCD-type applications, an n-channel injector contact that contacts the n-type quantum well interface for the last pixel element is the output of the imaging array and may be amplified directly if desired.

Further features and advantages of the invention will become more readily apparent from the following detailed description when taken in conjunction with the accompanying drawings.

BRIEF DESCRIPTION OF THE DRAWINGS

FIGS. 4A, 4B and 4C are energy band diagrams illustrating the operational modes of the thyristor-based pixel elements of FIG. 3A during an imaging cycle whereby charge is accumulated in and transferred out of a respective pixel element in accordance with the present invention.

FIG. 5 illustrates an exemplary epitaxial growth structure utilizing group III-V materials for realizing the thyristor-based pixel element of FIG. 3A and the optoelectrical/electrical/optical devices formed from this structure in accordance with the present invention.

FIGS. 6A, 6B1 and 6B2 are schematic views of an exemplary realization of two thyristor-based pixel elements formed in conjunction with the epitaxial growth structure of FIG. 5; FIG. 6A is a schematic plan view of the two thyristor-based pixel elements; FIG. 6B1 is a schematic cross-sectional view of the two thyristor-based pixel elements; and FIG. 6B2 is a schematic cross-sectional view of the p-channel injector terminal for the two thyristor-based pixel elements.

FIG. 6C is a diagram illustrating the potential along the n-type modulation doped quantum well interface within (and between) the two thyristor-based pixel elements of FIGS. 6A and 6B during the imaging operations performed by these pixel elements.

FIG. 8B is a diagram illustrating the potential along the n-type modulation doped quantum well interface within (and between) the thyristor-based pixel element and transfer gate of FIG. 8A during the imaging operations performed by the pixel element.

DESCRIPTION OF THE PREFERRED EMBODIMENTS

Figure 1:
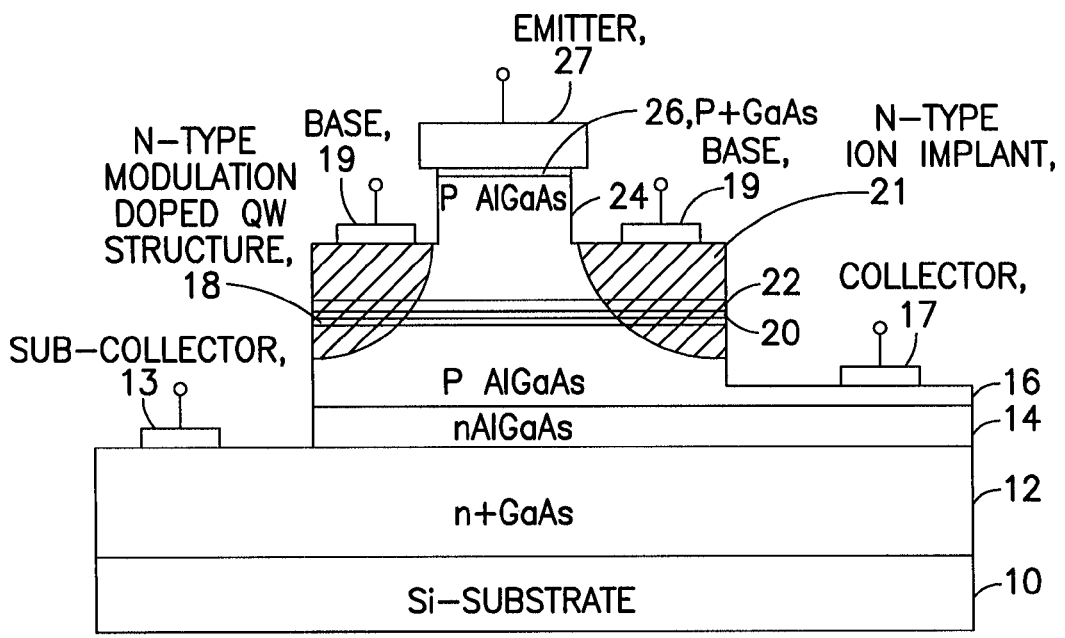
FIG. 1 is a schematic view showing an exemplary quantum-well base bipolar transistor device.

In accordance with the present invention, an imaging device is provided that includes complementary modulation doped quantum well interfaces formed between a top p+ layer structure and bottom n+ layer structure. Dielectrics are used above the top p+ layer and below the bottom n+ layer to form ¼ wavelength pairs for the imaging portion of the pixel; i.e., they constitute a resonant cavity at the wavelength of interest. In the preferred embodiment, each pixel element is formed from a mesa that includes a refractory anode terminal formed adjacent the highly doped top p+ layer structure. The anode terminal is used to control the transfer of charge into and/or from the pixel element. A p-channel injector terminal is operably coupled to the p-type modulation doped quantum well interface, and a cathode terminal is operably coupled to the bottom n+ layer. The p-channel injector terminal is used to empty the p-type quantum well interface of charge (e.g., holes). The cathode terminal is used to realize an electronic shutter that enables/disables the charge accumulation operations of the pixel element.

The pixel elements operate in three distinct modes: pixel setup mode; signal acquisition mode; and signal transfer mode. During pixel setup mode, the n-type quantum well interface is emptied of charge (e.g., electrons). During signal acquisition mode, charge is accumulated in the n-channel quantum well interface of the pixel element. The amount of accumulated charge is proportional to the power of the electromagnetic radiation at the desired wavelength that is received at the pixel element during the signal acquisition mode. During signal transfer mode, the accumulated charge is read out of the given pixel element (and transferred between pixel elements in CCD-type applications) utilizing the n-type quantum well interface as the pathway for charge transfer. In CCD-type applications, an n-channel injector contact that contacts the n-type quantum well interface for the last pixel is the output of the imaging array and may be amplified directly if desired.

The imaging array of the present invention (and the signals produced therefrom) can be used in many applications. For example, it can be used to perform imaging operations over nanosecond to millisecond time increments (due to the high speed of response of the 2D gas). Moreover, it can readily be adapted to image wavelengths over a broad spectrum of wavelengths (including mid-infrared wavelengths as well as long-infrared wavelengths). Moreover, the imaging array of the present invention can be efficiently integrated with a broad range of optical and electronic devices, for example to provide an integrated array together with associated optoelectronics and/or logic circuits and/or signal processing circuits.

Preferably, the imaging array of the present invention (and possibly other optoelectronic devices, logic circuits and/or signal processing circuits that are fabricated integral thereto) are realized from the inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties. With these structures, a fabrication sequence is used to make all the devices, including the imaging array, electrical devices (e.g., transistors) and optoelectronic devices (e.g., laser/detector/modulator) on a common substrate. In other words, n type and p type contacts, critical etches, dielectric depositions etc. are used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure.

The state of the charge in the n-type modulation doped quantum well interface and p-type modulation doped quantum well interface is controlled by conduction from either the anode or cathode as dictated by the bias conditions of the thyristor device. In addition, charge may be removed from the n-type modulation doped quantum well interface and p-type modulation doped quantum well interface by a current source (or pulse source) electrically coupled to the injector terminal for the respective interface. Optical devices are created from these structures by separating the metal anode into two sections which are connected electrically by the P+ layer along the top surface. The active device structure is formed between a bottom distributed bragg reflective (DBR) mirror and a top dielectric mirror, thereby forming a waveguide with an optical mode centered near the modulation doped quantum well interfaces.

A cross-section of a quantum-well-base bipolar transistor is shown in FIG. 1. The quantum-well-base bipolar transistor is interesting because of the way in which it combines the unipolar conduction of a typical Heterojunction FET (HFET) device and the bipolar conduction of a typical Heterojunction Bipolar Transistor (HBT). It is, in fact, a quantum-well-base bipolar transistor based upon modulation doping. The contacts to the modulation doped channel perform as source/drain contacts of a typical HFET with gate bias applied in the conventional way. The channel charge performs as the minority charge of a bipolar transistor. Then, as the charge flows into the channel it biases the internal barrier of the device to the flow of majority carriers from the emitter into the collector. Because of its combination of bipolar and FET principles, the device is sometimes referred to as a Bipolar Inversion Channel Field Effect Transistor (BICFET). Advantageously, the thermionic emission in the quantum-well-base bipolar transistor occurs vertically in the epitaxial growth direction and the distances are short (on the order of 100 Å) so that cutoff frequencies above 1 THz can be obtained without the need for extremely short lithographic dimensions of the device.

The device includes, starting from a semi-insulating substrate 10, an n+ GaAs contact layer 12 (which is electrically connected to a subcollector terminal metal layer 13), an n-type AlGaAs layer 14, a p-type AlGaAs layer 16 (which is electrically connected to a collector terminal metal layer 17), an n-type modulation doped quantum well structure 18 (which is electrically connected to base terminal metal layer 19 via n-type ion implants 21), an undoped spacer layer 20, a p+-type charge sheet 22, a p-type barrier layer of AlGaAs 24, and a P+ contact layer 26 of GaAs (which is electrically connected to emitter terminal metal layer 27). Received radiation is operably coupled to the n-type modulation doped quantum well structure 18 via the base terminal metal layer 19.

The responsivity of the device of FIG. 1 depends upon the change of the electron temperature of the 2D gas ($T_e$) with input power $P_{in}$ of the received radiation. This relationship can be understood by the following analysis. If an electron (or hole) is represented by its equation of motion in the presence of a perturbing electric field $E_0 e^{j\omega t}$, and one solves for displacements of the electron $x_0 e^{j\omega t}$, then one can solve for the velocity, the current flow and the average power absorbed by the RF field. In the steady state, this is balanced by the heat lost to the lattice by the emission of polar optical phonons. From this energy balance we obtain the result $$\Delta T_e = T_e - T_l \qquad (1)$$
$$= \frac{q^2 E_o^2}{2C_{th}m} \frac{\tau_m \tau_e}{1+\omega^2 \tau_m^2}$$
$$= \frac{q^2 \eta P_{in}}{2C_{th}m} \frac{\tau_m \tau_e}{1+\omega^2 \tau_m^2}$$

where m is the electron mass, $C_{th}$ is the specific heat of the electron (approximately equal to Boltzmann's constant, k), $T_e$ is the electron temperature, $T_l$ is the lattice temperature, $\tau_m$ is the momentum relation time, and $\tau_e$ is the energy relaxation time. The input power $P_{in}$ is related to the radiation field via $P_{in}=E_0^2/2\eta$, where $\eta$ is the intrinsic impedance of the material. An important parameter for sensitivity is $C_{th}$. Its inherently small value results in sizeable values of $T_e$ for small values of $P_{in}$. It is seen that, since the time constant $\tau_m$ is typically on the order of 0.1 picoseconds, the high frequency roll-off for the response of the electron gas is about 10 THz.

Figure 2:
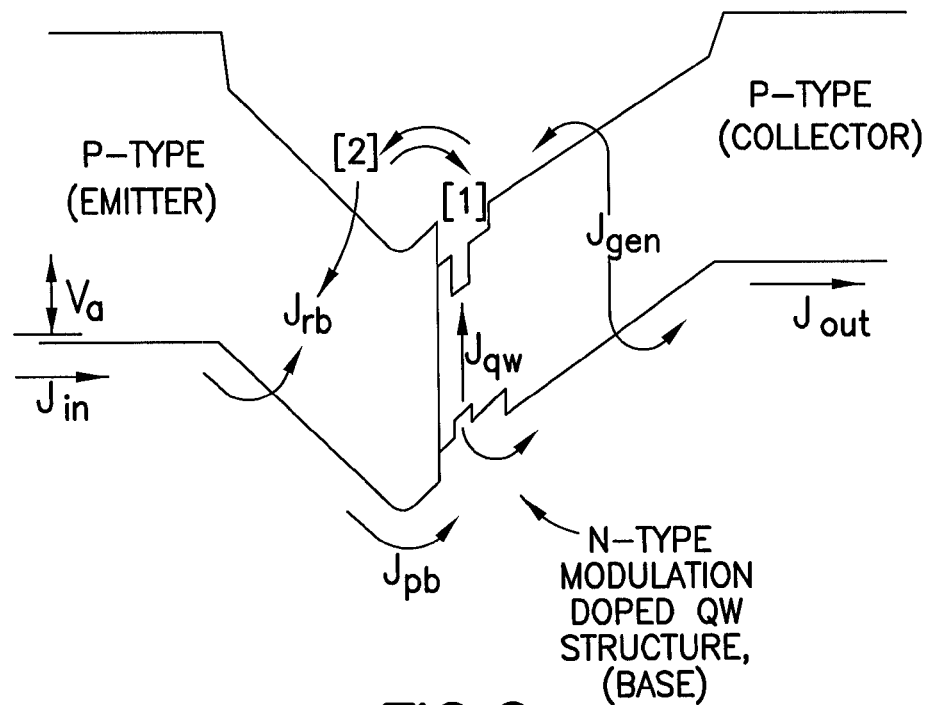
FIG. 2 is an energy band diagram illustrating the operation of the quantum-well base bipolar transistor device of FIG. 1 in response to radiation supplied to the quantum well base region of the device.

To understand the thermionic behavior of the device of FIG. 1, consider the energy diagram in FIG. 2. The important current components are shown which include the recombination component $J_{rb}$ (flow of holes from the emitter), the thermionic emission current (labeled "1") flowing from the n-type modulation doped layer to the quantum well, the thermionic emission current (labeled "2") flowing from the quantum well to the n-type modulation doped layer, and the generation current $J_{gen}$ in the collector which adds electrons to the quantum well and also supplies the hole current flowing to the back junction. The current flow equation is indicated in the figure, in which the recombination is a small current equal to the difference between large emission currents into and out of the quantum well (for zero bias, $J_{rb}=0$ and the emission currents are just balanced). In the absence of radiation (with some nominal bias $V_a$), the lattice temperature $T_l$ and the electron temperature $T_e$ are equal and $J_{rb}$ represents the dark current in the device. Another significant component is $J_{pb}$, representing thermionic emission over the barrier. The changes in the current $J_{pb}$ represent the output of the detector. The equation that represents this balance of currents is $$J_{rbo}\left[\left(\frac{n_o}{n_o^*}\right)^{1/2} e^{\Delta V_b/2V_T} - 1\right] = qv_{th}n_o e^{-\varphi_2/kT_e} - \qquad (2)$$
$$qv_{th} \frac{N_c e^{(E'_{Fn}-E_c)/kT}}{1+\frac{1}{4}e^{(E'_{Fn}-E_c)/kT}} e^{-\varphi_1/kT_l}$$

where the left hand side (LHS) is the recombination current flowing in the emitter as shown in FIG. 2. This is the continuity current written from the viewpoint of the modulation doping. The two terms on the right hand side (RHS) represent the thermionic emission components between the quantum well and the modulation doped layer and both of them contain T in the exponent of the exponential term. However, with the coupling of radiation into the quantum well, the temperature of the quantum well component becomes $T_e$ and the temperature of the component from the modulation doped layer to the quantum well remains at $T_L$. Therefore there is a net thermionic flow from the quantum well to the modulation doped layer. This leads to a decreasing value of $n_o$, which is the electron density in the quantum well. The change in $T_e$ will be small. We may expand this term and obtain the following:

$$J_{rbo}\left[\left(\frac{n_o}{n_o^*}\right)^{1/2} e^{\Delta V_b/2V_T} - 1\right] = qv_{th} n_o e^{-\varphi_2/kT_e} - \quad (3)$$

$$qv_{th} \frac{N_c e^{(E'_{Fn}-E_c)/kT}}{1+\frac{1}{4}e^{(E'_{Fn}-E_c)/kT}} e^{-\varphi_1/kT_l} +$$

$$qv_{th} n_o e^{-\varphi_2/kT_e} \frac{\varphi_2}{kT_L} \frac{\Delta T_e}{T_L}$$

We see that the last term is a driving force, which is proportional to the change $\Delta T_e$. We also see from (1), that this change in $T_e$ is proportional to the input power of the received radiation. Therefore the additional term corresponds to R*Pin where R is the responsivity in amps/watt for the basic mechanism of transferring electrons to the modulation doping. Thus the value of R is:

$$R = qv_{th} n_o e^{-\varphi_2/kT_e} \frac{\varphi_2}{kT_L} \frac{1}{T_L} \frac{q^2\eta}{2Cm} \frac{\tau_m \tau_e}{1+\omega^2 \tau_m^2} \quad (4)$$

The other equation that describes the current flow through the device is $$J_{rb} = J_{rbo}\left[\left(\frac{n_o}{n_o^*}\right)^{1/2} e^{\Delta V_b/2V_T} - 1\right] = J_{gen} \quad (5)$$

which simply states that the net current flowing through the device during this process must remain constant since the effect of the radiation is simply to shift the charge internal to the device. The shifting of charge from the well to the sheet region causes $n_o$ to decrease. From equation (5), since $J_{gen}$ is constant, $\Delta V_b$ will increase. The increase in $\Delta V_b$ will cause the current $J_{pb}$ in FIG. 2 to increase. It is this increase in current that represents the net output current of the device and is proportional to the input power of the received radiation. By rearranging (5) and calculating the current $\Delta J_{pb}$, we obtain $$\Delta J_{pb} = J_{pbco}\left\{\frac{J_{gen}}{J_{rbo}} - 1\right\}^2 \frac{n_o^*}{[(C_b + C_d)\Delta V_{bd} - C_d V_{CE}]^2} \frac{R}{qv} P_{in} = R_{eff} P_{in} \quad (6)$$

The output current is an increase in the collector current that flows in response to the input power $P_{in}$ of the received radiation. Substituting typical numbers yields $R_{eff}\approx 0.05$ A/W. This number is quite reasonable by comparison to typical responsivities for long wavelength infra-red (LWIR) radiation.

An important point should be noted here. The dark current flowing in the system is $J_{gen}$ and this is the generation current across the energy gap of the AlGaAs. This is not the current thermally activated out of a well of extremely low energy. The thermal currents flowing in and out of the well are always in balance even in equilibrium and under bias, and as such they produce no noise. It is only the net dark current $J_{gen}$ that produces noise. This means that the cryogenic cooling will not be required to eliminate the effects of dark current noise. Thus, the detection of the incident radiation occurs at room temperature.

Figure 3A:
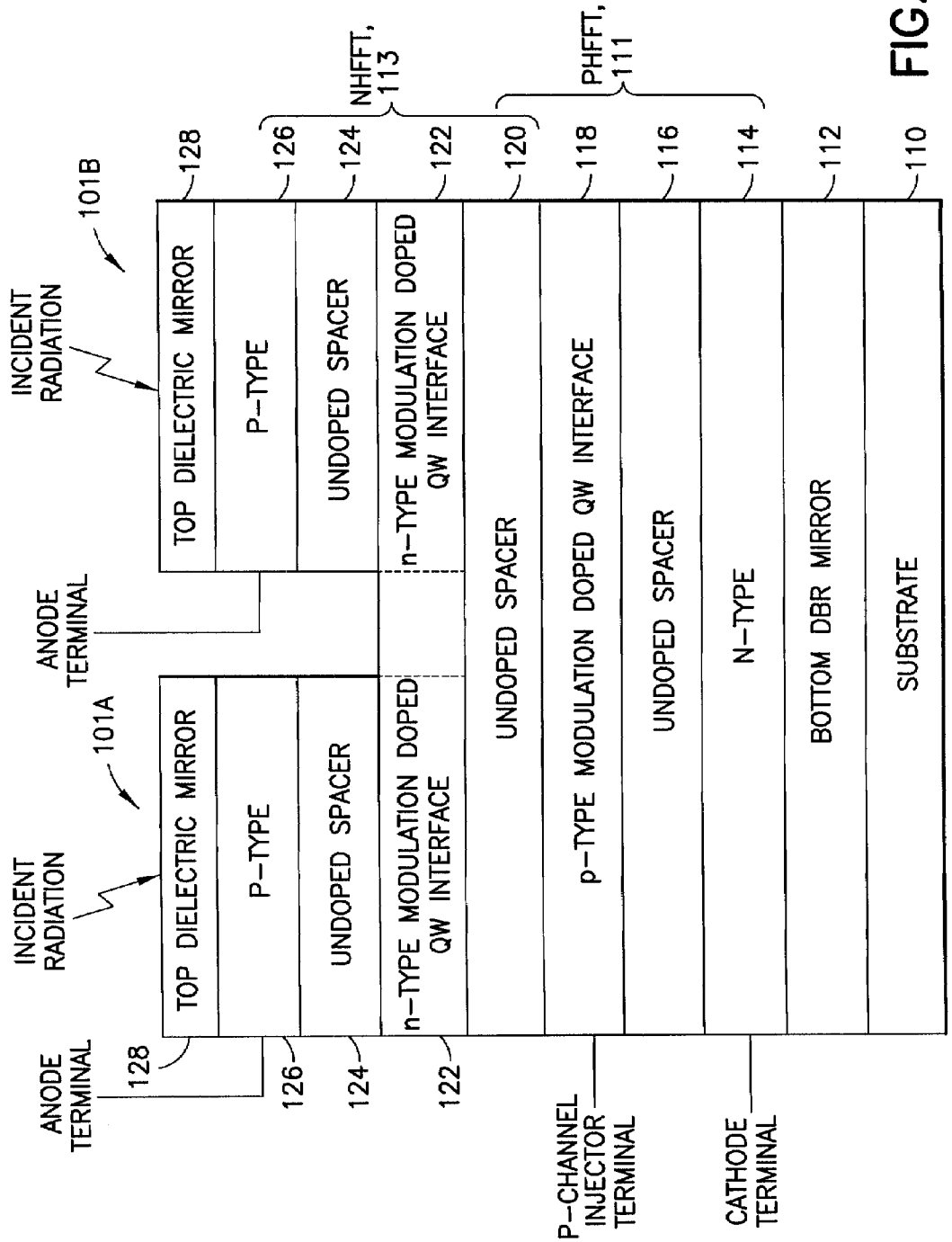
FIG. 3A is a schematic view showing two exemplary thyristor-based pixel elements in accordance with the present invention.
Figure 3B:
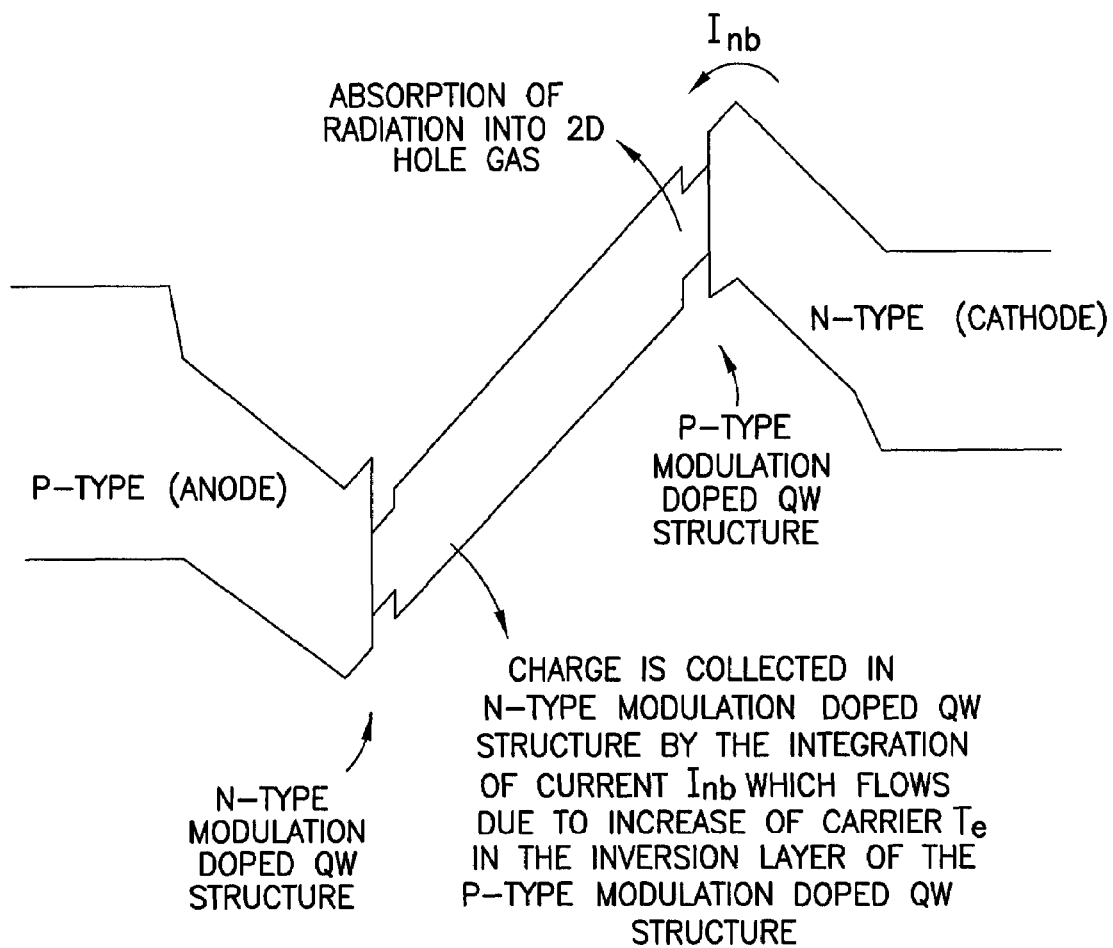
FIG. 3B is an energy band diagram illustrating the operation of the thyristor-based pixel element of FIG. 3A in response to incident radiation that is resonantly absorbed therein.

Alternatively, a thyristor structure may be used as a radiation detector. As shown in FIG. 3A, the thyristor structure includes an n-type quantum-well-base bipolar transistor and p-type quantum-well-base bipolar transistor arranged vertically to share a common collector region. The thyristor structure is formed inside a resonant cavity (provided by bottom and top dielectric mirrors) that is adapted to receive electromagnetic radiation in a desired portion of the electromagnetic spectrum. Similar to the operation of the n-type quantum well structure of the quantum-well-base bipolar transistor of FIG. 1, absorbed radiation will empty the p-type quantum well interface of the thyristor, thus accumulating a charge in the p-type modulation doped layer and producing a forward bias $\Delta v_b$ on the p-type quantum well interface barrier, which results in a current flow $I_{nb}$ as shown in FIG. 3B. The current $I_{nb}$ flows over the p-type quantum well interface barrier to the n-type quantum well interface. This current causes charge $Q_n$ to accumulate in the n-type quantum well interface. The accumulated charge $Q_n$ represents the intensity of the received radiation. The operation of the heterojunction-thyristor-based radiation detector is suitable for many imaging applications, including CCD-type imaging applications and active-pixel type imaging applications as described below in detail.

The structure of the two thyristor-based pixel elements 101A, 101B is illustrated in FIG. 3A. Note that the general structure of FIG. 3A can be configured to operate as a wide range of electronic devices (e.g., field effect transistors, bipolar transistors) such that these devices can be integrated to form a monolithic optoelectronic integrated circuit as described herein. The structure includes a bottom dielectric distributed bragg reflector (DBR) mirror 112 formed on a substrate 110. The bottom DBR mirror 112 typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4n$) optical thickness, the reflections from each of the boundaries will be added in phase to produce a large amount of reflected light (e.g., a large reflection coefficient) at the particular center wavelength $\lambda_D$. Deposited upon the bottom DBR mirror 112 is the active device structure which logically consists of two HFET devices. The first of these is a p-channel HFET device 111 (referred to herein as PHFET 111) comprising layers 114, 116, 118, and 120. The PHFET device 111 which has one or more p-type modulation doped quantum well channels and is positioned with the gate terminal on the lower side (i.e. on the bottom DBR mirror 112) and the collector terminal on the upper side. The second of these is an n-channel HFET device 113 (referred to herein as NHFET 113) comprising layers 120, 122, 124, and 126. The NHFET device 113 has one or more n-type modulation doped quantum well channels and is positioned with the gate terminal on the top side and the collector terminal on the lower side which is the collector of the p-channel device. Therefore a non-inverted N-channel device is stacked upon an inverted p-channel device to form the active device structure.

The active device layer structure begins with n-type layer(s) 114. Preferably, n-type layer(s) 114 include at least one layer that enables the formation of ohmic contacts thereto and a heavily doped layer that should not be depleted in any range of operation of the device, i.e. the total doping in this layer should exceed the total doping charge contained in the modulation doped layer of the p-type modulation doped quantum well interface 118 described below. This layer 114 also serves optically as a small part of the lower waveguide cladding for optical devices realized in this structure. Note that a majority of the lower waveguide cladding is provided by the lower DBR mirror 112 itself. Deposited on layer 114 is an undoped spacer layer 116. Layers 114 and 116 serve electrically as part of the gate of the p-channel HFET 111. In this configuration, layer 114 achieves low contact resistance and layer 116 defines the capacitance of the p-channel HFET 111 with respect to the p-type modulation doped quantum well heterostructure 118. Deposited on layer 116 is a p-type modulation doped quantum well interface 118 that defines one or more quantum wells (which may be formed from strained or unstrained heterojunction materials) spaced apart from a p-type modulation doped layer. Deposited on the p-type modulation doped quantum well interface 118 is an undoped spacer layer 120, which forms the collector of the P-channel HFET device 111. All of the layers grown thus far form the P-channel HFET device 111 with the gate ohmic contact on the bottom.

Undoped spacer layer 120 forms the collector region of the N-channel HFET device 113. Deposited on layer 120 is an n-type modulation doped quantum well interface 122 that defines one or more quantum wells (which may be formed from strained or unstrained heterojunction materials) spaced apart from an n-type modulation doped layer. Deposited on the n-type modulation doped quantum well interface 122 is an undoped spacer layer 124. Deposited on layer 124 are p-type layer(s) 126. Preferably, the p-type layer(s) 126 include a heavily doped layer that should not be depleted in any range of operation of the device, i.e. the total doping in this layer should exceed the total doping charge contained in the modulation doped layer of the n-type modulation doped quantum well structure 122 described above. In addition, the p-type layer(s) 126 preferably include at least one layer which enables the formation of ohmic contacts thereto. In this configuration, layer(s) 126 achieves low contact resistance and layer 124 defines the capacitance of the n-channel HFET 113 with respect to the n-type modulation doped quantum well interface 122. Layers 126 and 128 serve electrically as part of the gate of the n-channel HFET 113.

Alternatively, the active device structure may be described as a pair of stacked quantum-well-base bipolar transistors formed on the bottom DBR mirror 112. The first of these is an n-type quantum-well-base bipolar transistor (comprising layers 114, 116, 118, and 120) which has one or more quantum wells spaced apart from a p-type modulation doped layer and is positioned with the emitter terminal on the lower side (i.e. on the mirror as just described) and the collector terminal on the upper side. The second of these is an n-type quantum-well-base bipolar transistor comprising layers 120, 122, 124, and 126. This n-type quantum-well-base bipolar transistor has one or more quantum wells spaced apart from an n-type modulation doped layer and is positioned with the emitter terminal on the top side and the collector terminal on the lower side (which is the collector of the p-type quantum-well-base bipolar transistor). Therefore a non-inverted n-channel device is stacked upon an inverted p-channel device to form the active device structure. In this configuration, the gate terminal of the p-channel HFET device 111 corresponds to the emitter terminal of the p-type quantum-well-base bipolar transistor, the p-type quantum well interface 118 corresponds to the base region of the p-type quantum-well-base bipolar transistor, spacer layer 120 corresponds to the collector region of both the p-type quantum-well-base bipolar transistor and the n-type quantum-well-base bipolar transistor, the n-type quantum well interface 122 corresponds to the base region of the n-type quantum-well-base bipolar transistor, and the gate terminal of the n-channel HFET device 113 corresponds to the emitter electrode of the n-type quantum-well-base bipolar transistor.

To form a resonant cavity device, a top dielectric mirror 128 is formed over the p-type layer(s) 126 of the device. Incident radiation enters the resonant cavity in a vertical direction through an optical aperture (not shown) in the top surface (or bottom surface) of the device. The optical path length between the bottom DBR mirror and top dielectric mirror preferably represents an integral number of ½ wavelengths at the designated wavelength. Preferably, this optical path length is controlled by adjusting the thickness of one or more of the layers therebetween to enable this condition.

The thyristor-based pixel elements 101A, 101B are adapted to perform an imaging cycle including a Pixel Setup Mode, a Signal Integration Mode, and a Signal Transfer Mode.

In the Pixel Setup Mode, the n-type modulation doped quantum well interface 122 of the pixel element is emptied of free electrons, thereby forcing the n-type modulation doped quantum well interface 122 into a state of deep depletion. Preferably, this is accomplished by applying a multiphase clock scheme to the anode terminal electrode of the pixel element in a manner similar to the Signal Transfer Mode described below. Such operations clock the charge out of the pixel element via the n-type modulation doped quantum well interface 122. In CCD-type applications, the charge clocked out from a given thyristor-based pixel element (e.g., thyristor device 101A) is clocked into the adjacent thyristor-based pixel element (e.g., thyristor device 101B) utilizing the n-type modulation doped quantum well interface 122 between the adjacent thyristor-based pixel elements as the pathway for charge transfer. An n-channel injector contact that contacts the n-type modulation doped quantum well interface 122 for the last pixel is coupled to circuitry that disposes of the charge read out from the thyristor-based pixel elements in the Pixel Setup Mode. During the initialization operations of Pixel Setup Mode, electronic shutter control circuitry is preferably coupled to the cathode terminal electrode of the thyristor-based pixel element and maintains the cathode terminal electrode in a high impedance state (i.e., in other words the cathode terminal electrode floats) to thereby disable signal accumulation.

In the Signal Integration Mode, incident radiation is absorbed in the p-type modulation doped quantum well interface 118 of the thyristor-based pixel element. As described above, absorbed radiation will empty the p-type quantum well interface 118, thus accumulating a charge in the p-type modulation doped layer and producing a forward bias $\Delta v_b$ on the p-type quantum well barrier, which results in a current flow $I_{nb}$ as shown in FIG. 3B. The current $I_{nb}$ flows over the p-type barrier to the n-type modulation doped quantum well interface 122 of the thyristor-based pixel element. This current causes charge $Q_n$ to accumulate in the n-type modulation doped quantum well interface 122 of the pixel element. This accumulated charge $Q_n$ represents the intensity of the received radiation over the time period (sometimes referred to as "integration time period) of the Signal Integration Mode. Preferably, such charge-accumulation operations are accomplished by maintaining the voltage level at the anode terminal electrode at a positive voltage (e.g., on the order of three volts). In addition, electronic shutter circuitry coupled to the cathode terminal electrode of the thyristor-based pixel element couples the cathode terminal electrode to ground through a bias resistance (not shown) to enable conduction from the cathode terminal as shown in the potential diagram of FIG. 4B.

In the Signal Transfer Mode, the charge $Q_n$, which was accumulated in the n-type modulation doped quantum well interface 122 during the previous Signal Integration Mode, is read out from the thyristor-based pixel element. Preferably, this is accomplished by applying a multiphase clock scheme to the anode terminal electrode of the pixel element, which clocks the charge out of the pixel element via the n-type modulation doped quantum well interface 122. In CCD-type applications, the charge clocked out from a given thyristor-based pixel element (e.g., thyristor device 101A) is clocked into the adjacent thyristor-based pixel element (e.g., thyristor device 101B) utilizing the n-type modulation doped quantum well interface 122 between the adjacent thyristor-based pixel elements as the pathway for charge transfer. An n-channel injector contact that contacts the n-type modulation doped quantum well interface 122 for the last pixel is the output of the CCD-type imaging array and may be amplified directly if desired. A wide variety of multiphase clocking schemes well known in the CCD art (such as 4-phase, 3-phase, pseudo 2-phase, true two phase and virtual phase clocking schemes) may be employed to transfer charge between pixels. Such schemes are described in detail in "Kodak CCD Primer, #KCP-001, CHARGE-COUPLED DEVICE (CCD) IMAGE SENSORS," downloaded from http:/www.kodak.com/US/en/digital/pdf/ccdPrimerPart2.pdf on Apr. 24, 2003, herein incorporated by reference in its entirety. In an exemplary 1½ phase clocking scheme, a voltage level on the order of 0 volts may be applied to the anode terminal electrode for a given thyristor-based pixel element (e.g., thyristor device 101A) and a voltage level on the order of 1.5 volts may be applied the anode terminal electrode for the next thyristor-based pixel element (e.g., thyristor 101B), to thereby transfer the stored charge out of the given pixel element and into the next pixel element utilizing the n-type modulation doped quantum well interface 122 therebetween as the pathway for charge transfer. Upon completion of the Signal Transfer Mode, the imaging cycle is complete and the operation continues to the Pixel Setup Mode of the next imaging cycle.

Figure 4C:
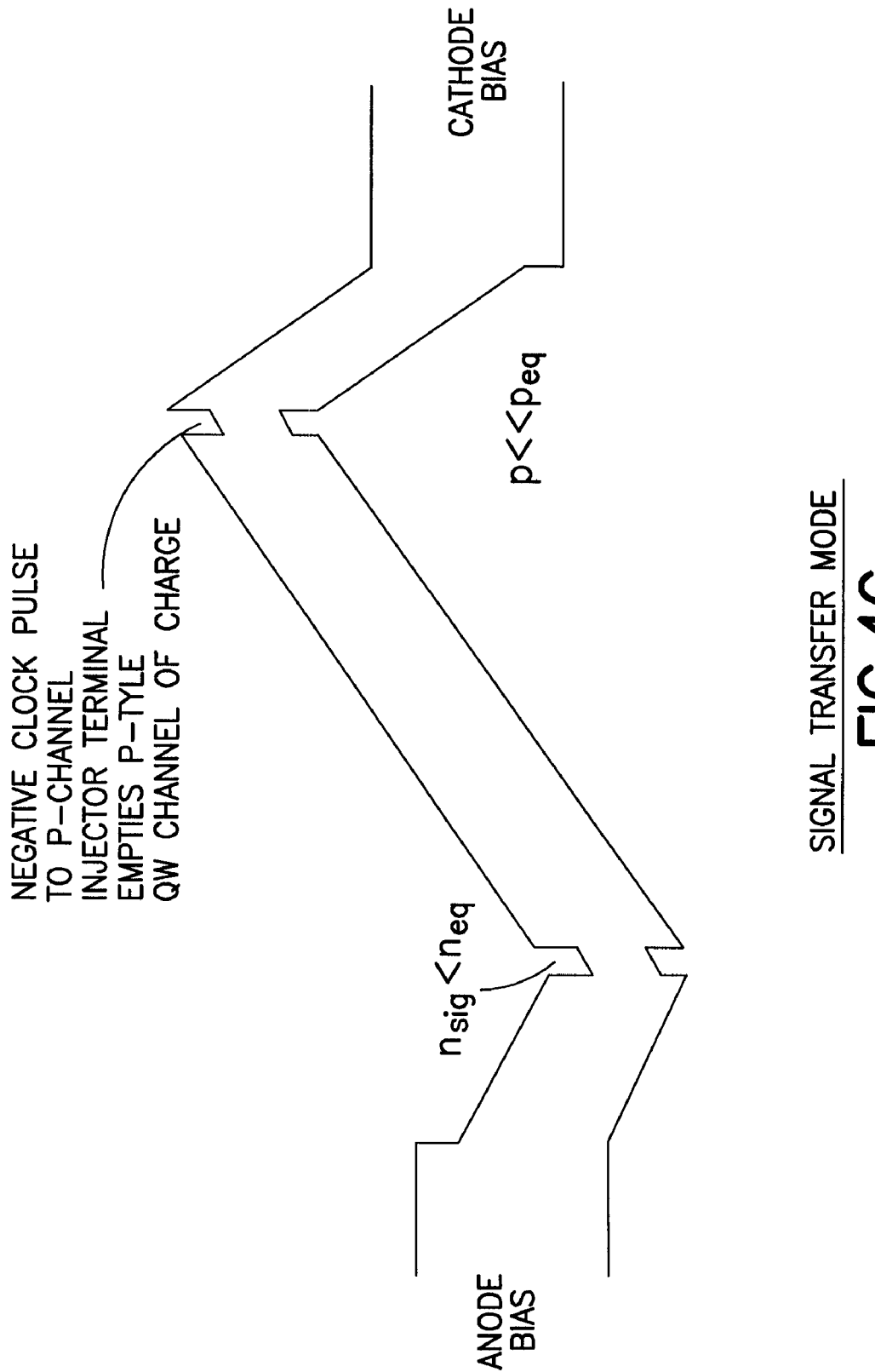

During the Signal Transfer Mode, electronic shutter circuitry coupled to the cathode terminal electrode of the pixel element disables signal accumulation. Preferably, this is accomplished by biasing the cathode terminal electrode of the pixel element such that conduction does not occur from the cathode terminal to the n-type quantum well interface 122 of the pixel element. During the Signal Transfer Mode, it is preferable that the p-type modulation doped quantum well interface 118 of the thyristor-based pixel element be emptied of free holes, thereby forcing the p-type modulation doped quantum well interface 118 into a state of deep depletion. Preferably, this is accomplished by applying a negative clock pulse to the p-channel injector terminal of the pixel element such that the p-type modulation doped quantum well interface is emptied of holes as shown in FIG. 4C. Alternatively, this can be accomplished by holding the potential of the p-channel injector terminal of the pixel element at a constant level and applying a positive voltage pulse to the cathode terminal electrode of the pixel element such that the p-type modulation doped quantum well interface is emptied of holes.

The epitaxial growth structures described above may be realized with a material system based on group III-V materials (such as GaAs/AlGaAs). Alternatively, strained silicon heterostructures employing silicon-germanium (SiGe) layers may be used to realize the multilayer structures described herein. FIG. 5 illustrates an exemplary epitaxial growth structure utilizing group III-V materials for realizing the structure of FIG. 3A and the optoelectrical/electrical/optical devices formed from this structure in accordance with the present invention.

The structure of FIG. 5 can be made, for example, using known molecular beam epitaxy (MBE) techniques. As shown, a first semiconductor layer 1151 of AlAs and a second semiconductor layer 1152 of GaAs are alternately deposited (with preferably at least seven pairs) upon a semi-insulating gallium arsenide substrate 1149 in sequence to form the bottom distributed bragg reflector (DBR) mirror 112. The number of AlAs layers will preferably always be one greater than the number of GaAs layers so that the first and last layers of the mirror are shown as layer 1151. In the preferred embodiment the AlAs layers 1151 are subjected to high temperature steam oxidation to produce the compound $Al_xO_y$ so that a mirror will be formed at the designed center wavelength. This center wavelength is selected such that all of the resonant wavelengths for the various cavities of the array will be subject to high reflectivity. Therefore the thicknesses of layers 1151 and 1152 in the mirror are chosen so that the final optical thicknesses of GaAs and $Al_xO_y$ are one quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as 22 pairs) to achieve the reflectivity needed for efficient lasing.

Deposited upon the mirror is the active device structure which consists of two HFET devices. The first of these is the p-channel HFET (PHFET) 111 (see FIG. 3A), which has one or more p-type modulation doped quantum wells and is positioned with the gate terminal on the bottom (i.e. on the mirror 112 just described) and the collector terminal above. The second of these is an n-channel HFET (NHFET) 113, which has one or more n-type modulation doped quantum wells and is positioned with the gate terminal on top and the collector terminal below. The collector region of the NHFET device 113 also functions as the collector region of the PHFET device 111. However, the collector terminal of the NHFET device 113 is a p-type contact to p-type quantum well(s) disposed below (above) the collector region, while the collector terminal of the PHFET device 111 is a n-type contact to n-type quantum well(s) disposed above the collector region. Therefore a non-inverted n-channel device is stacked upon an inverted p-channel device to form the active device structure.

The active-device layer structure begins with layer 1153 of N+ type GaAs that enables the formation of ohmic contacts thereto (for example, when contacting to the cathode terminal of a thyristor device, the gate terminal of an inverted p-channel HFET device, the sub-collector terminal of an n-channel HFET device, or the emitter terminal of a p-type quantum-well-base bipolar device). Layer 1153 has a typical thickness of 1000-3000 Å and a typical n-type doping of $3.5\times10^{18}$ cm$^{-3}$. Deposited on layer 1153 is layer 1154 of n-type $Al_{x1}Ga_{1-x1}As$ with a typical thickness of 500-3000 Å and a typical doping of $1\times10^{17}$ cm$^{-3}$. The parameter x1 is preferably in the range between 70% and 80% (for example, on the order of 70%) for layer 1154. This layer serves as part of the PHFET gate and optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are 4 layers (1155a, 1155b, 1155c, and 1155d) of $Al_{x2}Ga_{1-x2}As$. These 4 layers (collectively, 1155) have a total thickness about 380-500 Å and where x2 is about 15%. The first layer 1155a is about 60-80 Å thick and is doped N+ type in the form of delta doping. The second layer 1155b is about 200-300 Å thick and is undoped. The third layer 1155c is about 80 Å thick and is doped P+ type in the form of delta doping. The fourth layer 1155d is about 20-30 Å thick and is undoped to form a spacer layer. This layer forms the lower separate confinement heterostructure (SCH) layer for the laser, amplifier and modulator devices. The N+ doped GaAs layer 1153, the n-type AlGaAs layer 1154 and n-type AlGaAs layer 1155a correspond to the n-type layer(s) 114 of FIG. 3A, and the undoped AlGaAs layer 1155b corresponds to the undoped spacer layer 116 of FIG. 3A.

The next layers define the quantum well(s) that form the inversion channel(s) during operation of the PHFET 111. For a strained quantum well, this includes a spacer layer 1156 of undoped GaAs that is about 10-25 Å thick and then combinations of a quantum well layer 1157 that is about 40-80 Å thick and a barrier layer 1158 of undoped GaAs. The quantum well layer 1157 may be comprised of a range of compositions. In the preferred embodiment, the quantum well is formed from an $In_{0.2}Ga_{0.8}AsN$ composition with the nitrogen content varying from 0% to 5% depending upon the desired natural emission frequency. Thus, for a natural emission frequency of 0.98 μm, the nitrogen content will be 0%; for a natural emission frequency of 1.3 μm, the nitrogen content will be approximately 2%; and for a natural emission frequency of 1.5 μm, the nitrogen content will be approximately 4-5%. The well barrier combination will typically be repeated (for example, three times as shown), however single quantum well structures may also be used. Unstrained quantum wells are also possible. Following the last barrier of undoped GaAs is a layer 1159 of undoped $Al_{x2}Ga_{1-x2}As$ which forms the collector of the PHFET device 111 and is about 0.5 μm in thickness. All of the layers grown thus far form the PHFET device 111 with the gate contact on the bottom. The layers between the P+ AlGaAs layer 1155c and the last undoped GaAs barrier layer 1158 correspond to the p-type modulation doped heterojunction quantum well structure 118 of FIG. 3A. Undoped AlGaAs layer 1159 corresponds to the undoped spacer layer 120 of FIG. 3A.

Layer 1159 also forms the collector region of the NHFET device 113. Deposited on layer 1159 are two layers (collectively 1160) of undoped GaAs of about 200-250 Å total thickness, which form the barrier of the first n-type quantum well. Layer 1160 is thicker than the normal barrier layer of about 100 Å because it accommodates the growth interruption to change the growth temperature from 610° C. (as required for optical quality $Al_{x2}Ga_{1-x2}As$ layers) to about 530° C. for the growth of InGaAs. Therefore layer 1160 includes a single layer 1160a of about 150 Å and a barrier layer 1160b of about 100 Å. The next layer 1161 is the quantum well of $In_{0.2}Ga_{0.8}As$, which is undoped and about 40-80 Å in thickness. It is noted that the n-type quantum well layer 1161 need not be of the same formulation as the p-type quantum well layer 1157. The barrier layer 1160b of 100 Å and quantum well layer 1161 may be repeated, e.g., three times. Then there is a barrier layer 1162 of about 10-30 Å of undoped GaAs which accommodates a growth interruption and a change of growth temperature. Next there are four layers (collectively 1163) of $Al_{x2}Ga_{1-x2}As$ of about 300-500 Å total thickness. These four layers (1163) include a spacer layer 1163a of undoped $Al_{x2}Ga_{1-x2}As$ that is about 20-30 Å thick, a modulation doped layer 1163b of N+ type doping of $Al_{x2}Ga_{1-x2}As$ (with doping about $3.5\times10^{18}$ cm$^{-3}$) that is about 80 Å thick, a spacer layer 1163c of undoped $Al_{x2}Ga_{1-x2}As$ that is about 200-300 Å thick, and a P+ type delta doped layer 1163d of $Al_{x2}Ga_{1-x2}As$ (with doping about $3.5\times10^{18}$ cm$^{-3}$) that is about 60-80 Å in thickness. Layers 1163b and 1163d form the top plate and bottom plate of a parallel plate capacitor which forms the field-effect input to all active devices. The doping species for layer 1163d is preferably carbon (C) to ensure diffusive stability. In contrast to layer 1163b which is always depleted, layer 1163d should never be totally depleted in operation. For the optoelectronic device operation, layer 1163 is the upper SCH region. The layers between the undoped GaAs barrier layer 1160a and the N+ AlGaAs layer 1163b correspond to the n-type modulation doped heterojunction quantum well structure 122 of FIG. 3A. Undoped AlGaAs layer 1163c corresponds to the undoped spacer layer 124 of FIG. 3A.

One or more layers (collectively 1164) of p-type $Al_{x1}Ga_{1-x1}As$ are deposited next to form part of the upper waveguide cladding for the laser, amplifier and modulator devices. Note that a majority of the upper waveguide cladding for waves propagating in the guide formed by the optically active region of the device is provided by the upper dielectric mirror itself. The upper dielectric mirror causes the light to be guided partially as a dielectric waveguide and partially as a mirror waveguide. Preferably, layer 1164 has a thickness on the order of 500-1500 Å, and includes a first thin sublayer 1164a that is 10-20 Å thick and has a P+ doping of $10^{19}$ cm$^{-3}$ and a second sublayer 1164b that is 700 Å thick and has a P doping of $1\times10^{17}$–$5\times10^{17}$ cm$^{-3}$. The parameter x1 of layer 1164 is preferably about 70%. Deposited next is an ohmic contact layer 1165 (which may comprise a single layer of GaAs or a combination of GaAs (1165a) and InGaAs (1165b) as shown). Layer 1165 is about 50-100 Å thick and is doped to a very high level of P+ type doping (about $1\times10^{20}$ cm$^{-3}$) to enable formation of ohmic contacts thereto (for example, when contacting to the anode terminal of a thyristor device). The p-type layers 1163b, 1164a, 1164b, 1165a and 1165b correspond to the p-type layer(s) 126 of FIG. 3A.

Alternatively, the active device structure may be described as a pair of stacked quantum-well-base bipolar transistors formed on the bottom DBR mirror (layers 1151/1152). The first of these is an p-type quantum-well-base bipolar transistor (comprising layers 1153 through 1159) which has one or more p-type modulation doped quantum wells and is positioned with the emitter terminal on the lower side (i.e. on the bottom mirror as just described) and the collector terminal on the upper side. The second of these is an n-type quantum-well-base bipolar transistor (comprising layers 1159 through 1165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the cathode terminal of the thyristor device corresponds to the emitter electrode of the p-type quantum-well-base bipolar transistor, the p-type quantum well structure (layers 1155c though 1158) corresponds to the base region of the p-type quantum-well-base bipolar transistor, spacer layer 1159 corresponds to the collector region of both the p-type quantum-well-base bipolar transistor and the n-type quantum-well-base bipolar transistor, the n-type quantum well structure (layers 1160a through 1163b) corresponds to the base region of the n-type quantum-well-base bipolar transistor, and the anode terminal of the thyristor device correspond to the emitter electrode of the n-type quantum-well-base bipolar transistor.

To form a resonant cavity device, a top dielectric mirror is formed over the top p-type layer 1165b. Incident radiation enters the resonant cavity in a vertical direction through an optical aperture (not shown) in the top surface (or bottom surface) of the device. The optical path length between the bottom DBR mirror and top dielectric mirror preferably represents an integral number of ½ wavelengths at the designated wavelength. Preferably, this optical path length is controlled by adjusting the thickness of one or more of the layers therebetween to enable this condition.

The structure of FIG. 5 may also be used to realize various optoelectronic devices, including transistor devices (such as n-channel HFET devices, p-channel HFET devices, n-type quantum-well-base bipolar transistors and p-type quantum-well-base bipolar transistors), and other optoelectronic and waveguide devices. Such devices are described in detail in U.S. patent application Ser. No. 10/323,388, filed on Dec. 19, 2002; and U.S. patent application Ser. No. 10/340,942, filed on Jan. 13, 2003; incorporated by reference above in their entireties.

FIGS. 6A, 6B1, 6B2 and 6C illustrate schematic views of an exemplary realization of two thyristor-based pixel elements. The structure of layers 1149 through 1165b as described above with respect to FIG. 5 is provided. To connect to the anode of the thyristor-based pixel elements, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. The refractory anode terminals 136A and 136B of the thyristor-based pixel elements are deposited and defined preferably via liftoff of metal layer 610.

Then mesas are formed to define the imaging areas for the pixel elements of the array. The imaging area for each given pixel element (labeled 620a for pixel element A and 620b for pixel element B) is disposed adjacent the anode terminal metal layer 610 for the given pixel element as shown in FIGS. 6A and 6B1. Preferably, the pixel element mesas are formed by etching down to (or near) p+-type layer 1163d.

In conjunction with the formation of the pixel element mesas, an ion implant 170 of n+-type is performed into the portion of the mesa that is not covered by the anode metal layer as shown in FIG. 6B1. The purpose of n+-type implants 170 is to move the threshold of the implanted region 191 of the n-type modulation doped quantum well interface of each pixel element to a normally-on condition (i.e., on condition with zero anode voltage). Note that the region 192 of the n-type modulation doped quantum well interface under the anode metal layer, which is not subject to the n+-type implants 170, has a threshold with a normally-off condition (i.e., off condition with zero anode voltage). In this configuration, the implanted region 191 acts as a charge storage region and the region 192 acts as a voltage-controlled barrier as described below in more detail.

In conjunction with the formation of the pixel element mesas, interpixel transfer regions 622 are formed between the pixel elements of the array as shown in FIGS. 6A and 6B1. The n-type modulation doped interface in the interpixel transfer regions 622 is used for charge transfer between adjacent pixel elements as described herein in detail. Preferably, an ion implant 171 of n+ type is performed using a photomask that is aligned to the alignments marks to implant n-type ions into the n-type modulation doped quantum well interface of the interpixel transfer regions 622. The n+-type ion implants 171 provide for improved charge transfer efficiency as described below.

In addition, an ion implant 172 of p+-type is performed using a photomask that is aligned to the alignments marks, to thereby form contacts to the p-type modulation doped quantum well interface for each pixel element as shown in FIG. 6B2. During this operation, mesas are formed by etching preferably down to the undoped spacer layer 1159. The resulting mesas are then subject to P+ ion implant 172. The implant 172 is subsequently metallized as described below to form a p-channel injector terminal 139 as shown in FIGS. 6A and 6B2.

Connection of the cathode of the thyristor-based pixel elements is made by etching down to the n-type ohmic contact layer 1153. The exposed portion of the n-type ohmic contact layer 1153 is subsequently metallized as described below to form a cathode terminal 140 as shown in FIG. 6A.

Next the thyristor-based pixel elements are subjected to a rapid thermal anneal (RTA) of the order of 900° C. or greater to activate all implants. Then the thyristor-based pixel elements are isolated from one another by etching down to the semi-insulating substrate 1149. Oxygen implants may be used to create high resistance regions below the implants. In addition, the AlAs layers 1151 (and other layers with large aluminum percentages) are oxidized to achieve passivation, isolation and the bottom DBR mirror.

The next step in the fabrication is the deposition (preferably via lift off) of metal contacts. These contacts come in three forms. One is a metal layer 612 (preferably comprising an n-type Au alloy metal such as AuGe/Ni/Au) deposited on the n-type contact layer 1153 to form the cathode terminal electrode 140 as seen in FIG. 6A. The second is a metal layer 614 (preferably comprising a p-type Au metal alloy such as AuZn/Cr/Au) deposited on the P+ type implant 172 to form the p-channel injector terminal electrode 139 as shown in FIGS. 6A and 6B2. The third is the metal layer 616 (preferably comprising an n-type Au alloy metal such as AuGe/Ni/Au) deposited on the N+ type implant 171 to form an n-channel injector terminal electrode for one or more thyristor-based pixel elements. In the exemplary configuration shown, the pixel elements share a common p-channel injector terminal and a common cathode terminal as best shown in FIG. 6A. Note that an n-channel injector terminal is preferably formed for the last pixel of the array. This n-channel injector terminal is the output of the array and may be amplified directly if desired.

To form thyristor-based pixels suitable for vertical optical injection into a resonant vertical cavity, a top dielectric mirror is added to the structure preferably by the deposition of one or more dielectric layer pairs 196/197 (one pair shown in FIG. 6B). Such dielectric pairs typically comprise $SiO_2$ and a high refractive index material such as GaAs, Si, or GaN, respectively.

Note that optoelectronic devices (e.g., lasers, optical detectors, optical modulators, optical amplifiers) include n-type ion implants (not shown) into the top contact layer 1165b. An optical aperture is defined by the separation between these implants. These implants create a p-n junction in the layers between the n-type quantum well(s) and the surface, and the aperture between the implants defines the region in which the current may flow, and therefore the optically active region of the device. The current cannot flow into the n-type implanted regions because of the barrier to current injection. In addition, to form a device suitable for in-plane optical injection into a resonant vertical cavity and/or in-plane optical emission from the resonant vertical cavity, a diffraction grating (not shown), as described in more detail in U.S. Pat. No. 6,021,243, incorporated by reference above in its entirety) is added to the structure as described above.

Also note that the operations described above to realize a thyristor device (and other optoelectronic devices) from the multilayer structure of FIG. 5 are readily adaptable to realize a wide variety of electronic devices (such as HFET transistors, quantum-well-base transistors, etc, and associated logic and signal processing circuitry) from the multilayer structure of FIG. 5.

The thyristor-based pixel elements of FIGS. 6A-6C are adapted to perform an imaging cycle including a Pixel Setup Mode, a Signal Integration Mode, and a Signal Transfer Mode.

In the Pixel Setup Mode, the n-type modulation doped quantum well interface (layers 1160a-1163b) of the thyristor-based pixel elements are emptied of free electrons, thereby forcing the n-type modulation doped quantum well interface into a state of deep depletion. Preferably, this is accomplished by applying a multiphase clock scheme to the anode terminal electrodes 136A, 136B, . . . of the pixel elements in a manner similar to the Signal Transfer Mode described below. Such operations transfers charge between pixel elements via the n-type modulation doped quantum well interface (layers 1160a-1163c) of the interpixel transfer region therebetween. An n-channel injector contact that contacts the n-type modulation doped quantum well interface (layers 1160a-1163c) for the last pixel is coupled to circuitry that disposes of the charge read out from the thyristor-based pixel elements in the Pixel Setup Mode. During the initialization operations of Pixel Setup Mode, electronic shutter control circuitry is preferably coupled to the common cathode terminal electrode 140 of the thyristor-based pixel elements and maintains the common cathode terminal electrode 140 in a high impedance state (i.e., in other words the cathode terminal electrode floats) to thereby disable signal accumulation.

In the Signal Integration Mode, incident radiation is absorbed in the p-type modulation doped quantum well interface (layers 1155c-1158) of the thyristor-based pixel elements. As described above, absorbed radiation will empty the p-type quantum well interface, thus accumulating a charge in the p-type modulation doped layer and producing a forward bias $\Delta v_b$ on the p-type quantum well interface barrier, which results in a current flow $I_{nb}$ as shown in FIG. 3B. The current $I_{nb}$ flows over the p-type QW barrier to the n-type modulation doped quantum well interface. This current causes charge $Q_n$ to accumulate in the n-type modulation doped quantum well interface. This accumulated charge $Q_n$ represents the intensity of the received radiation at the given pixel element over the time period (sometimes referred to as "integration time period") of the Signal Integration Mode. Preferably, such charge-accumulation operations are accomplished by maintaining the voltage level at the anode terminal electrodes 136A, 136B, . . . of the thyristor-based pixel elements at a positive voltage (e.g., on the order of three volts). In addition, electronic shutter circuitry coupled to the common cathode terminal electrode 140 couples the common cathode terminal electrode 140 to ground through a bias resistance (not shown) to enable conduction from the common cathode terminal 140 as shown in the potential diagram of FIG. 4B.

In the Signal Transfer Mode, the charge $Q_n$, which was accumulated in the n-type modulation doped quantum well interface during the previous Signal Integration Mode, is read out from the thyristor-based pixel elements. Preferably, this is accomplished by applying a multiphase clock scheme to the anode terminal electrodes 136A, 136B, . . . of the pixel elements, which clocks the charge out of the pixel elements via the n-type modulation doped quantum well interface. In CCD-type applications, the charge clocked out from thyristor-based pixel element A is clocked into the adjacent thyristor-based pixel element B utilizing the n-type modulation doped quantum well interface (layers 1160a-1163c) of the interpixel transfer regions 622 therebetween as the pathway for charge transfer. These operations are repeated over the pixel elements of the CCD-type array. An n-channel injector contact that contacts the n-type modulation doped quantum well interface for the last thyristor-based pixel element is the output of the CCD imaging array and may be amplified directly if desired. Upon completion of the Signal Transfer Mode, the imaging cycle is complete and the operation continues to the Pixel Setup Mode of the next imaging cycle.

As previously described, a wide variety of multiphase clocking schemes well known in the CCD art (such as 4-phase, 3-phase, pseudo 2-phase, true two phase and virtual phase clocking schemes) may be employed to transfer charge between pixels. Such schemes are described in detail in "Kodak CCD Primer, #KCP-001, CHARGE-COUPLED DEVICE (CCD) IMAGE SENSORS," downloaded http://www.kodak.com./US/en/digital/pdf/ccdPrimerPart2.pdf on Apr. 24, 2003, incorporated by reference above in its entirety. In an exemplary 1½ phase clocking scheme, a voltage level on the order of 0 volts may be applied to the anode terminal electrode for a given thyristor-based pixel element (e.g., pixel element A) and a voltage level on the order of 1.5 volts may be applied the anode terminal electrode for the next thyristor-based pixel element (e.g., pixel element B), to thereby transfer the stored charge out of the given pixel element and into the next pixel element utilizing the n-type modulation doped quantum well interface as the pathway for charge transfer. This 1½ phase clocking scheme relies on the potential differences between the implanted region 191 and the voltage-controlled barrier region 192 within the n-type modulation doped quantum well interface of the pixel elements as described above and shown in FIG. 6B. In this configuration, during charge transfer operations, charge is accumulated in the thyristor-based pixel element A by applying a reverse-bias between the anode terminals 136A, 136B, respectively, as shown in potential profile labeled "Charge Accumulation" in FIG. 6C. A reverse-bias is also applied between the anode terminal 136A and the anode terminal for the previous pixel element (not shown), respectively. In this bias state, the barrier regions 192-A and 192-B act as a barrier to the flow of charge between the pixel elements. The accumulated charge is transferred from the implanted region 191-A for pixel element A to the implanted region for the implanted region 191-B for pixel element B by applying a forward-bias between the anode terminals 136A, 136B, respectively, as shown in potential profile labeled "Charge Transfer" in FIG. 6C. In this bias state, the potential barrier provided by the barrier region 192-B is eliminated (or substantially reduced) such that charge flows freely from the implanted region 191-A for pixel element A to the implanted region for the implanted region 191-B via the n-type modulation doped quantum well interface therebetween. These charge transfer operations are repeated over the pixel elements of the CCD-type array to read out the charge accumulated in the thyristor-based pixel elements in a sequential fashion.

During the charge transfer operations, the relative voltage difference supplied to the anode terminals of the adjacent pixels is applied to the n-type ion implanted interpixel transfer regions 622 that is disposed between the pixel mesas as shown in FIGS. 6A and 6B1. Preferably, the length of the resistor (i.e., the spacing between pixel mesas) is selected to maximize the charge velocity between pixels which therefore maximizes transfer efficiency. More specifically, in order to maximize transfer efficiency, it is necessary to maximize the drift current between pixels. More specifically, the drift current is given by J=q*v*n, where v is the carrier velocity, q is the electronic charge, and n is the carrier density. The drift current is maximized by obtaining a maximum value of v (which is achieved by selecting the appropriate resistor length) and by obtaining a maximum value of n (which is obtained by the n+-implants 170 of the interpixel transfer regions 622 as shown in FIG. 6B1).

During the Signal Transfer Mode, electronic shutter circuitry coupled to the cathode terminal electrode 140 of the pixel elements disables signal accumulation. Preferably, this is accomplished by biasing the cathode terminal electrode of the pixel elements such that conduction does not occur from the cathode terminal to the n-type quantum well interface (layers 1160a-layers 1163b) of the thyristor-based pixel elements. During the Signal Transfer Mode, it is preferable that the p-type modulation doped quantum well interface (layers 1155c-1158) of the thyristor-based pixel elements are emptied of free holes, thereby forcing the p-type modulation doped quantum well interface into a state of deep depletion. Preferably, this is accomplished by applying a negative clock pulse to the p-channel injector terminal 139 of the pixel elements such that the p-type modulation doped quantum well interface is emptied of holes as shown in FIG. 4C. Alternatively, this can be accomplished by holding the potential of the p-channel injector terminal 139 of the pixel elements at a constant level and applying a positive voltage pulse to the cathode terminal electrode 140 of the pixel elements such that the p-type modulation doped quantum well interface is emptied of holes.

Figure 7A:
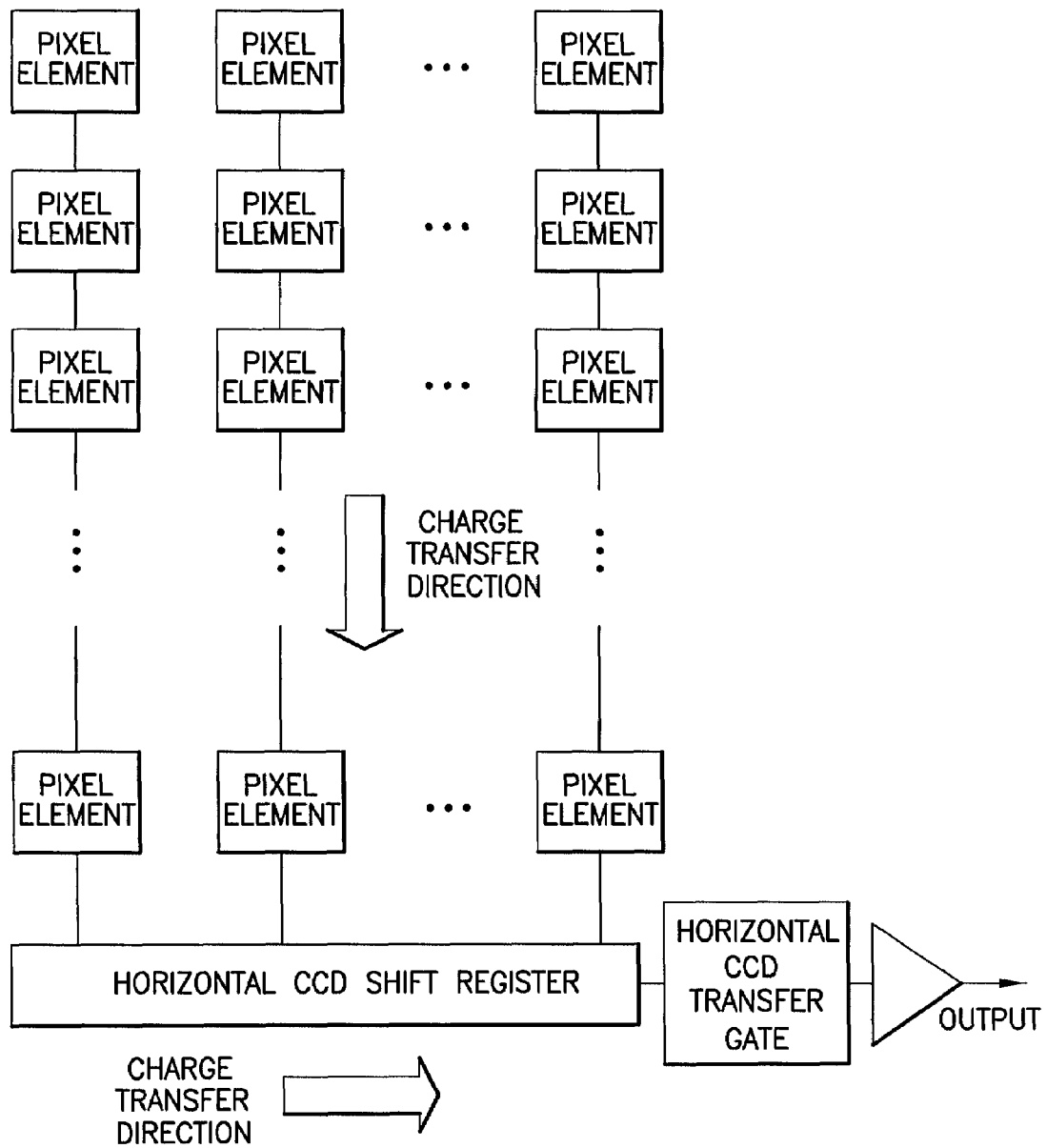
FIG. 7A is a functional block diagram illustrating the system architecture of a full-frame-type imaging array.

The thyristor-based pixel elements as described above may be utilized in a variety of imaging arrays. For example, FIG. 7A illustrates a full-frame-type imaging array wherein the thyristor-based pixel elements are arranged in columns of CCD-type elements. The last pixel/CCD in each column is coupled to a horizontal CCD shift register. In this architecture, the charge stored in the pixel/CCD elements is transferred vertically to the horizontal CCD shift register for output therefrom.

Figure 7B:
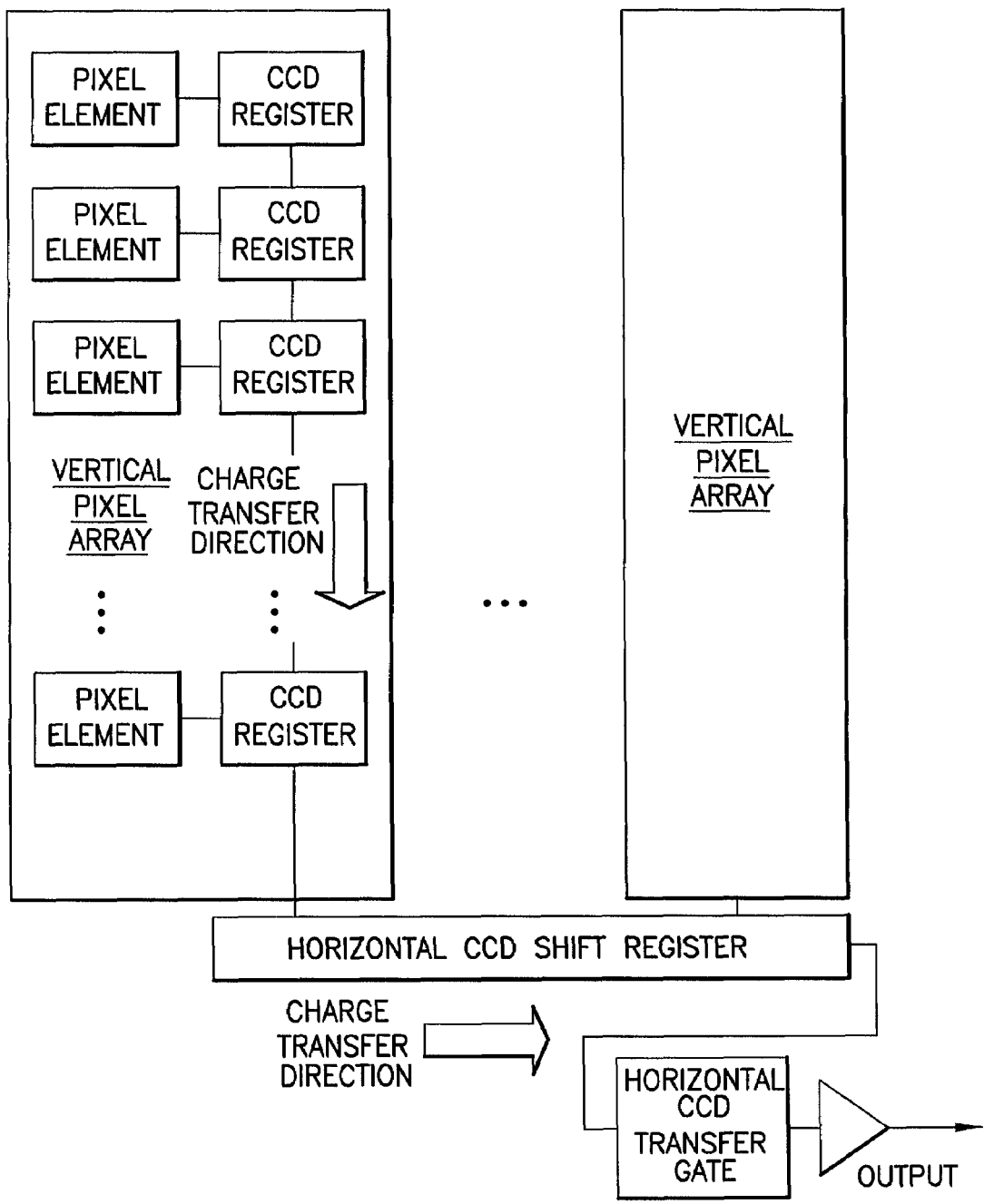
FIG. 7B is a functional block diagram illustrating the system architecture of an interline-type imaging array.

FIG. 7B illustrates an interline-type imaging array wherein the thyristor-based pixel elements are arranged in columns. The pixels of a given column are electrically coupled to CCD registers to form a vertical pixel array. The last CCD register of each vertical pixel array is coupled to a horizontal CCD shift register. In this architecture, the charge stored in the pixel elements of a given vertical pixel array is transferred to the corresponding CCD registers. The charge stored in the CCD registered is then transferred to the horizontal CCD shift register for output therefrom.

Note that the horizontal CCD shift register of FIG. 7A and the vertical CCD shift register and horizontal CCD shift register of FIG. 7B may be realized by thyristor-based CCD elements similar to those described above with respect to FIGS. 6A-6C, which are adapted to perform the CCD-type charge transfer operations as described herein. These elements do not perform imaging operations. Therefore, the common p-channel injector terminal 139 and the common cathode terminal 140 may be omitted.

Figure 8A:
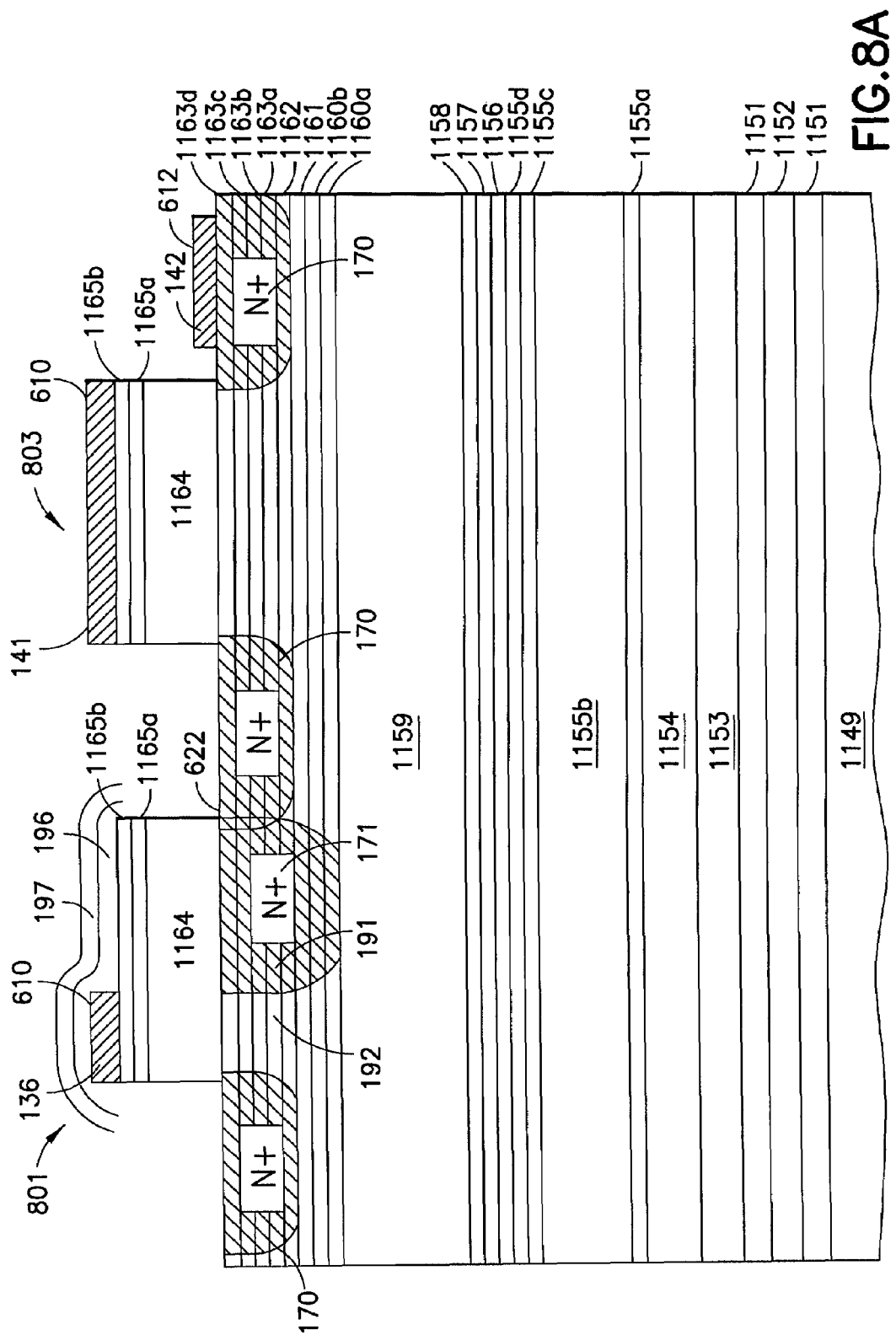
FIG. 8A is a schematic cross-sectional view of an exemplary realization of a thyristor-based pixel element and transfer gate formed in conjunction with the epitaxial growth structure of FIG. 5.
Figure 8C:
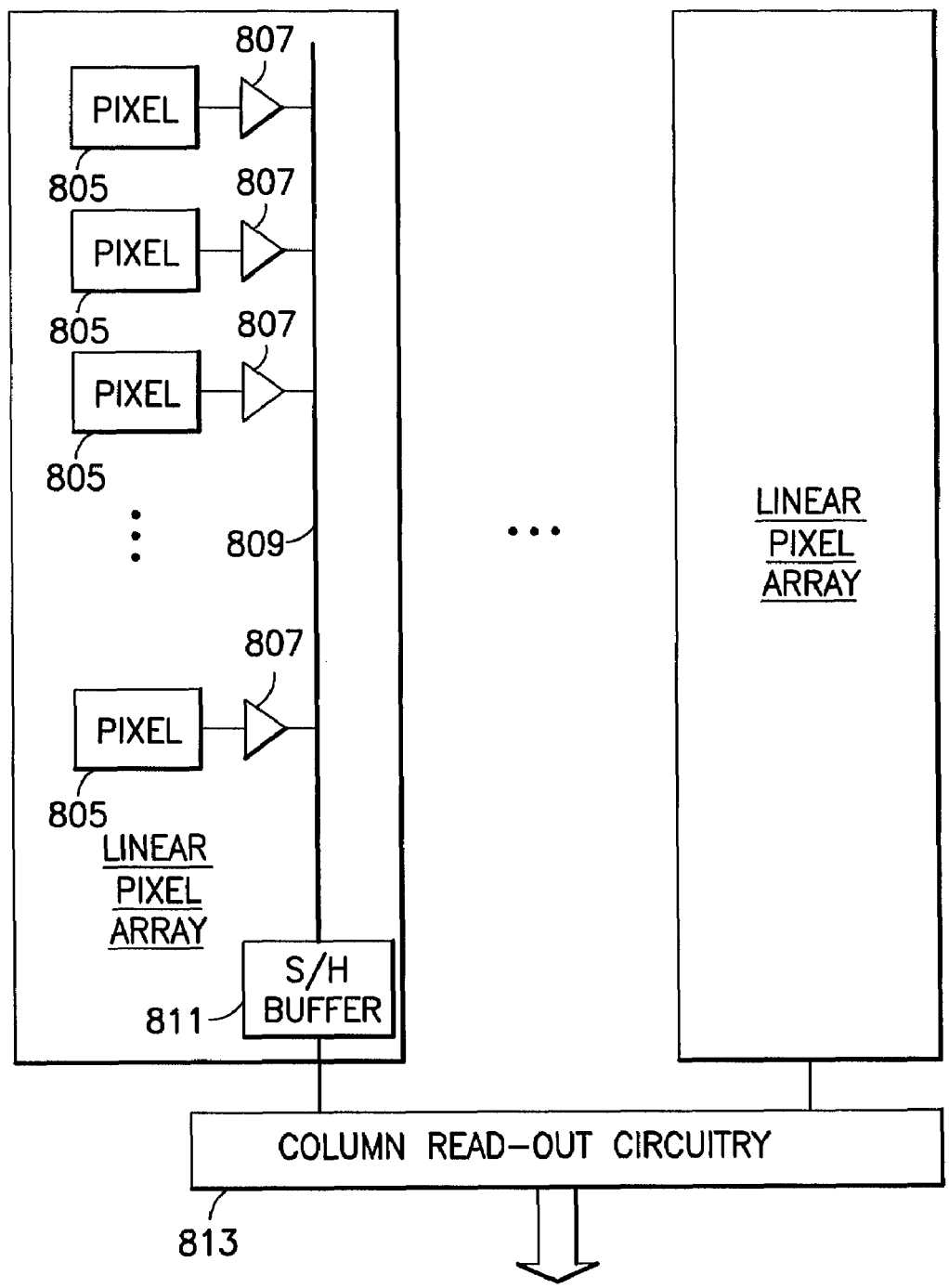
FIG. 8C is a functional block diagram illustrating the system architecture of an active-pixel-type imaging array utilizing pixels based on the thyristor-based pixel element and transfer gate of FIGS. 8A and 8B.

Turning now to FIGS. 8A-8C, the thyristor-based pixel element can also be used in an active-pixel-type imaging array. As shown in FIG. 8A, the thyristor-based pixel element 801 operates in conjunction with a transfer gate 803. The thyristor-based pixel element 801 is realized from the multilayer structure of FIG. 5 in the manner described above. The transfer gate 803 is realized from the multilayer structure of FIG. 5 in a manner similar to that described above with respect to the thyristor-based pixel element; however, the metal layer 610 is patterned to substantially cover the mesa that forms the transfer gate 803 as shown. In addition, the threshold adjusting implant 171 is omitted such that the transfer gate 803 operates in a normally-off condition. The thyristor-based pixel element 801 is adapted to perform an imaging cycle including a Pixel Setup Mode, a Signal Integration Mode, and a Signal Transfer Mode as described below.

In the Pixel Setup Mode, the n-type modulation doped quantum well interface (layers 1160a-1163b) of the thyristor-based pixel element 801 is emptied of free electrons, thereby forcing the n-type modulation doped quantum well interface into a state of deep depletion. Preferably, this is accomplished by applying a multiphase clock scheme to the anode terminal electrode 136 of the pixel element and the gate terminal electrode 141 of the transfer gate 803 in a manner similar to the Signal Transfer Mode described below. Such operations transfer charge from the pixel element to the n-channel injector terminal 142 of the transfer gate 803. The n-channel injector terminal 142 is coupled to circuitry that disposes of the charge read out from the thyristor-based pixel element in the Pixel Setup Mode. This operation, which is depicted by the potential diagram of FIG. 4A, puts the n-type modulation doped quantum well interface of the thyristor-based pixel element 801 into a non-steady state of depletion (devoid of electrons), which will eventually be changed to a steady state of electrons by thermal processes during the signal integration mode. During the initialization operations of Pixel Setup Mode, electronic shutter control circuitry is preferably coupled to the cathode terminal electrode 140 of the thyristor-based pixel element and maintains the cathode terminal electrode 140 in a high impedance state (i.e., in other words the cathode terminal electrode floats) to thereby disable signal accumulation.

In the Signal Integration Mode, incident radiation is absorbed in the p-type modulation doped quantum well interface (layers 1155c-1158) of the thyristor-based pixel element 801. As described above, absorbed radiation will empty the p-type quantum well, thus accumulating a charge in the p-type modulation doped layer and producing a forward bias $\Delta v_b$ on the p-type quantum well barrier, which results in a current flow $I_{nb}$ as shown in FIG. 3B. The current $I_{nb}$ flows over the p-type QW barrier to the n-type modulation doped quantum well interface of the thyristor-based pixel element 801. This current causes charge $Q_n$ to accumulate in the n-type modulation doped quantum well interface. This accumulated charge $Q_n$ represents the intensity of the received radiation at the pixel element over the time period (sometimes referred to as "integration time period) of the Signal Integration Mode. Preferably, such charge-accumulation operations are accomplished by maintaining the voltage level at both the anode terminal electrode 136 of the pixel element 801 and the gate terminal electrode 141 of the transfer gate 803 at a positive voltage (e.g., on the order of three volts). In addition, the cathode terminal electrode 140 is coupled to ground through a bias resistance (not shown) to enable conduction from the cathode terminal 140 as shown in the potential diagram of FIG. 4B.

In the Signal Transfer Mode, the charge $Q_n$, which was accumulated in the n-type modulation doped quantum well interface during the previous Signal Integration Mode, is read out from the thyristor-based pixel element 801. Preferably, this is accomplished by applying a reverse-bias between the anode terminal electrode 136 and the gate electrode 141 of the transfer gate 803 such that the potential barrier provided by the n-type quantum well interface of the transfer gate 803 is substantially lowered as shown in the potential profile labeled "Charge Transfer" in FIG. 8B. The charge stored in the storage region of the pixel element 801 flows through the n-type modulation doped quantum well interface of the transfer gate 803 and output from the transfer gate 803 by an n-channel injector terminal electrode 142. The electrode 142 is coupled to the n-type modulation doped quantum well interface of the transfer gate 803 via an n+-type implant 170.

During the Signal Transfer Mode, electronic shutter circuitry coupled to the cathode terminal electrode of the pixel elements disables signal accumulation. Preferably, this is accomplished by biasing the cathode terminal electrode of the pixel elements such that conduction does not occur from the cathode terminal to the n-type quantum well interface (layers 1160a-layers 1163b) of the thyristor-based pixel elements. During the Signal Transfer Mode, it is preferable that the p-type modulation doped quantum well interface (layers 1155c-1158) of the thyristor-based pixel elements 801 are emptied of free holes, thereby forcing the p-type modulation doped quantum well interface into a state of deep depletion. Preferably, this is accomplished by applying a negative clock pulse to the p-channel injector terminal 139 of the pixel element 801 such that the p-type modulation doped quantum well interface is emptied of holes as shown in FIG. 4C. Alternatively, this can be accomplished by holding the potential of the p-channel injector terminal 139 of the pixel element at a constant level and applying a positive voltage pulse to the cathode terminal electrode 140 of the pixel element such that the p-type modulation doped quantum well interface is emptied of holes.

The thyristor-based pixel element 801 and transfer gate 803 form a pixel 805 of the active-pixel array. The pixels 805 are typically arranged as a linear array as shown in FIG. 8C. The output electrode 142 of the transfer gate 803 of each pixel is electrically coupled to a corresponding output amplifier 807. The output amplifiers 807 of a given linear pixel array are electrically coupled to a common output line 809. In this architecture, the charge stored in the pixel elements of a given linear pixel array are selectively output (one at a time) to the corresponding output amplifier 807 for supply to S/H buffer 811 and readout circuitry 813 via the common output line 809 as shown.

In the exemplary embodiments described above, the vertical dimension of the resonant cavity for each pixel element corresponds to the desired wavelength of electromagnetic energy that is to be absorbed therein as part of the image sensing operations of the device. In alternate embodiments, the vertical dimensions of the resonant cavities of the pixel elements can vary such that they correspond to different wavelengths of electromagnetic energy. For example, some of the pixel elements can correspond to a first wavelength in one of the short-infrared region (SWIR; 1-3 µm), the mid-infrared region (MWIR; 3-5 µm), the long-infrared region (LWIR; 8-12 µm); and the very-long-infrared region (VLWIR; >12 µm), while other pixel elements correspond to a second wavelength in another of the these regions. This can be accomplished through the use of subtractive epitaxy of one or more spacer layers formed between the top and bottom mirrors that define the cavity as set forth in U.S. application Ser. No. 10/627,043, filed on Jul. 25, 2003, herein incorporated by reference in its entirety. In this configuration, the pixel elements will preferentially absorb particular components of the spectrum. This capability enables multi-spectral imaging. Such multi-spectral response can also be integrated into the pixel element itself. For example, assuming the spectral response of the quantum well structures are broad enough (which can be accomplished by adjusting the width of the quantum wells of such structures), the pixel elements can be divided into sections (for example, 3 in a row, side-by-side, staggered, etc) to perform imaging whereby the sections of the pixel correspond to different wavelengths.

Also note that detection of energy in the long-infrared (LWIR) region via intersubband absorption requires that the incident energy propagate in a direction such that the electric field is normal to the quantum wells of the pixel element. This constraint stems from the quantum selection rule. In practice, this constraint is not satisfied due to a number of factors, including strain in the wells and high electric fields. One way to overcome these limitations is to diffract the incident LWIR radiation from the vertical mode to an in-plane mode. Such diffraction is preferably accomplished with a second-order diffraction grating incorporated between the top mirror and the active device structure for the pixel element. In this configuration, the pitch of the grating is preferably equal to the wavelength in the desired material. No blaze is required. The LWIR energy may propagate equally in both directions. The grating acts in concert with the vertical cavity. The resonant cavity causes only the desired wavelength of interest to resonate. Every pass of the resonant LWIR energy through the grating diffracts the LWIR energy into the in-plane mode (which is parallel to the surface and quantum wells of the pixel element). This mode resonates back and forth in the active structure of the pixel element and is absorbed. In the event that the quantum selection rule inhibits absorption, these modifications will enhance the absorption of the pixel element.

In alternate embodiments, the thyristor-based pixel structure and corresponding method of operation can be utilized to detect THz radiation. In this configuration, the resonant cavity is not needed, and thus the top and bottom mirrors are omitted. Instead, one or more antenna elements that are adapted to receive the desired THZ spectrum are operably coupled via corresponding p-channel injector terminals to the p-type modulation doped quantum well interface of the thyristor-based detector. Details of exemplary thyristor-based THz detectors is set forth in International Application No. PCT/US03/13183, incorporated by reference above in its entirety. Preferably, such thyristor-based THz detectors operate during the signal transfer mode in each imaging cycle to empty the p-type modulation doped quantum well interface (layers 1155c-1158) of the thyristor-based THz detector of free holes, thereby forcing the p-type modulation doped quantum well interface into a state of deep depletion. Preferably, this is accomplished by biasing the cathode terminal electrode of the thyristor-based detector such that conduction does not occur from the cathode terminal to the n-type quantum well interface of the thyristor-based detector and applying a negative clock pulse to the p-channel injector terminal of the thyristor-based detector such that the p-type modulation doped quantum well interface is emptied of holes. Alternatively, this can be accomplished by holding the potential of the p-channel injector terminal of the thyristor-based detector at a constant level and applying a positive voltage pulse to the cathode terminal electrode of the thyristor-based detector such that the p-type modulation doped quantum well interface is emptied of holes.

There have been described and illustrated herein several embodiments of thyristor-based imaging arrays, thyristor-based CCD elements and thyristor-based detectors. While particular embodiments of the invention have been described, it is not intended that the invention be limited thereto, as it is intended that the invention be as broad in scope as the art will allow and that the specification be read likewise. Thus, while particular materials, fabrication processes, circuit elements, and circuit architectures have been disclosed, it will be understood the others can be used as well. In addition, while particular device structures have been disclosed, it will be appreciated that others can be used as well. It will therefore be appreciated by those skilled in the art that yet other modifications could be made to the provided invention without deviating from its spirit and scope as claimed.

What is claimed is:

1. A method of generating an image of received electromagnetic radiation within a predetermined wavelength range comprising:
providing a plurality of pixel elements, each pixel element including complementary first-type and second-type modulation doped quantum well interfaces that are formed in a resonant cavity on a substrate and that are spaced apart from one another, wherein electromagnetic radiation within the predetermined wavelength range is received at said pixel element and injected into said resonant cavity; and
adapting said pixel elements to operate in a signal integration mode whereby charge is accumulated in said second-type modulation doped quantum well interface of said pixel elements over an integration time period.

2. A method according to claim 1, wherein:
the amount of charge accumulated in said second-type modulation doped quantum well interface for said pixel element is proportional to power of the electromagnetic radiation within the predetermined wavelength range that is received at said pixel element.

3. A method according to claim 1, wherein:
the electromagnetic radiation within the predetermined wavelength range increases electron temperature of a two-dimensional electron gas at said first-type modulation doped quantum well interface thereby producing a current resulting from thermionic emission over a potential barrier provided by said first-type modulation doped quantum well interface, wherein said current results in accumulation of charge in said second-type modulation doped quantum well interface.

4. A method according to claim 3, wherein:
said current is proportional to power of the electromagnetic radiation within the predetermined wavelength range that is received at the pixel element.

5. A method according to claim 1, wherein:
said first-type modulation doped quantum well interface and said second-type modulation doped quantum well interface are spaced apart from one another in a vertical dimension.

6. A method according to claim 1, wherein:
each pixel element is adapted to operate in at least one of the following modes:
 i) a pixel setup mode whereby charge is emptied from said second-type modulation doped quantum well interface for said pixel element; and
 ii) a signal transfer mode whereby charge is read out from said second-type modulation doped quantum well interface.

7. A method according to claim 6, wherein:
each pixel element is adapted to perform a sequence of imaging cycles, each cycle including said pixel setup mode, said signal integration mode, and said signal transfer mode.

8. A method according to claim 6, wherein:
free charge is emptied from said first-type modulation doped quantum well interface during said signal transfer mode.

9. A method according to claim 6, wherein:
charge is transferred between pixel elements in said signal transfer mode to thereby perform CCD-type imaging operations.

10. A method according to claim 9, wherein:
charge is transferred between pixel elements over a pathway defined by a second-type modulation doped interface between pixel elements.

11. A method according to claim 10, wherein:
said second-type modulation doped interface between pixel elements is doped with donor ions to increase carrier density.

12. A method according to claim 10, wherein:
length of said second-type modulation doped interface between pixel elements is selected for desired charge velocity between pixel elements.

13. A method according to claim 1, wherein:
each pixel element includes an undoped spacer layer disposed between said first-type modulation doped quantum well interface and said second-type modulation doped quantum well interface.

14. A method according to claim 13, wherein:
each pixel element includes
 at least one first-type ion implant in electrical contact with said first-type modulation doped quantum well interface, and
 second-type ion implants in electrical contact with said second-type modulation doped quantum well interface.

15. A method according to claim 14, wherein:
each pixel element includes
 at least one first channel injector terminal formed from a metal layer deposited on said at least one first-type ion implant, and
 second channel injector terminals formed from a metal layer deposited on said second-type ion implants.

16. A method according to claim 15, wherein:
each pixel element includes
 an anode and cathode formed such that said first-type modulation doped quantum well interface and said second-type modulation doped quantum well interface are disposed between said anode and said cathode,
 an anode terminal electrically coupled to said anode, and
 a cathode terminal electrically coupled to said cathode thereby integrally forming a thyristor-based pixel element on said substrate.

17. A method according to claim 16, further comprising:
emptying free charge from said second-type modulation doped quantum well interface for said given pixel element in a pixel setup mode.

18. A method according to claim 16, wherein:
said second-type modulation doped quantum well interface for each pixel element includes a potential barrier portion and a charge storage portion, said charge storage portion formed via a threshold-adjusting ion implant therein, said potential barrier portion disposed under said anode terminal and providing a voltage-controlled potential barrier.

19. A method according to claim 18, further comprising:
applying clock pulses to said anode terminals to transfer charge between adjacent pixel elements utilizing voltage-controlled adjustment of said potential barrier provided by said potential barrier portion of said pixel elements.

20. A method according to claim 16, further comprising:
emptying free charge from said first-type modulation doped quantum well interface for said given pixel element in a signal transfer mode.

21. A method according to claim 16, further comprising:
selectively coupling said cathode terminal to a load element during a signal integration mode whereby charge is accumulated in said second-type modulation doped quantum well interface for the given pixel element.

22. A method according to claim 16, further comprising:
placing said cathode terminal for the given pixel element in a high-impedance state during at least one of
a pixel setup mode whereby charge is emptied from said second-type modulation doped quantum well interface for the given pixel element, and
a signal transfer mode whereby charge is read out from said second-type modulation doped quantum well interface for the given pixel element.

23. A method according to claim 1, wherein:
said plurality of pixel elements are part of a full-frame-type imaging array.

24. A method according to claim 1, wherein:
said plurality of pixel elements are part of an interline-type imaging array.

25. A method according to claim 1, wherein:
said plurality of pixel elements are part of an active-pixel-type imaging array.

* * * * *